United States Patent
Brueck et al.

(10) Patent No.: US 6,320,648 B1
(45) Date of Patent: Nov. 20, 2001

(54) METHOD AND APPARATUS FOR IMPROVING PATTERN FIDELITY IN DIFFRACTION-LIMITED IMAGING

(76) Inventors: Steven R. J. Brueck, 5601 Cometa Ct. NE., Albuquerque, NM (US) 87111-1910; Xiaolan Chen, 9490 SW. 146th Ter., #6, Beaverton, OR (US) 97007

( * ) Notice: Subject to any disclaimer, the term of this patent is extended or adjusted under 35 U.S.C. 154(b) by 0 days.

(21) Appl. No.: 09/414,861

(22) Filed: Oct. 12, 1999

Related U.S. Application Data
(60) Provisional application No. 60/103,997, filed on Oct. 12, 1998.

(51) Int. Cl.[7] ............................ G03B 27/42; G03B 27/54; G03B 27/32
(52) U.S. Cl. .................................. 355/67; 355/53; 355/77
(58) Field of Search .................... 355/53, 67, 68–71, 355/77; 430/5, 20, 22, 30, 311

(56) References Cited

U.S. PATENT DOCUMENTS

| | | | |
|---|---|---|---|
| 4,872,135 | * 10/1989 | Peterson et al. | 364/822 |
| 5,046,112 | * 9/1991 | Chang et al. | 382/8 |
| 5,467,166 | * 11/1995 | Shiraishi | 355/71 |
| 5,535,029 | * 7/1996 | Clark | 359/63 |
| 5,610,684 | * 3/1997 | Shiraishi | 355/55 |
| 5,667,918 | * 9/1997 | Brainerd et al. | 430/5 |
| 5,677,757 | * 10/1997 | Taniguchi et al. | 355/71 |

OTHER PUBLICATIONS

M. D. Levenson, "Wavefront engineering from 500 nm to 100 nm CD." Proc. SPIE 3048. 2–13 (1997).

L. W. Liebmann, B. Grenon, M. Lavin, S. Schomody, and T. Zell, "Optical proximity correction a first look at manufacturability," Proc. SPIE 2322. 14th Annual BACUS Symposium on Photo–mask Technology and Management, 229–238 (1994) (Abstract only).

(List continued on next page.)

Primary Examiner—Russell Adams
Assistant Examiner—Hung Henry Nguyen
(74) Attorney, Agent, or Firm—Snell & Wilmer, L.L.P.

(57) ABSTRACT

The present invention involves the use of pupil plane filters to enhance optical imaging for both lithography and microscopy. The present invention includes numerous pupil plane filter strategies for enhancing optical lithography. A square pupil plane filter suitably restricts the imaging to a nearly diffraction limited regime. Moreover, pupil plane filters are suitably used in off-axis illumination (OAI) and imaging interferometric lithography (ILL). The techniques of OAI and ILL along with the use of pupil-plane filters are applicable in, for example, any diffraction-limited situation where the limit is imposed by the characteristics of the optical system rather than the transmission medium and where the illumination system is under the control of the experimenter.

5 Claims, 22 Drawing Sheets

OTHER PUBLICATIONS

Figure 2:
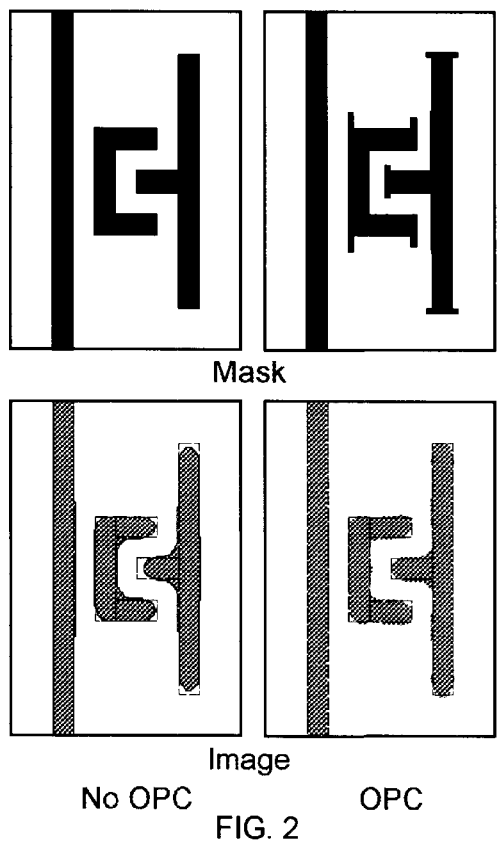

M. Noguchi, M. Muraki, Y. Iwasaki, and N. Magome, "Sub–half micron lithography system and phase–shifting effect," Proc. SPIE 1674, 92–104 (1992).

K. Tournai, H. Tanabe, H. Nozue, and K. Kasama. "Resolution improvement with annual illumination," Proc. SPIE 1674, 753–764 (1992) (Abstract only).

K. Kamon, T. Miyamoto, Y. Myoi, H. Nagata, M. Tanaka and K. Hone, "Photolithography system using annular illumination," Jpn. J. Appi. Phys., vol. 30, No. 1 1B. 3021–3029 (1991).

N. Shiraishi, S. Hirukawa, Y. Takeuchi and N. Magome, "New imaging technique for 64M–DRAM," SPIE 1674, Optical/Laser Microlithography V, 741–752 (1992).

M. D. Levenson, N. S. Viswanathan, and R. A. Simpson, "Improving resolution in photolithography with a phase shifting mask," IEEE Tans. Electron Devices. ED–29, 1828–1836 (1982).

M. D. Levenson, D. G. Goodman, S. Lindsey, P. Bayer and H. Santini, "The phase sifting mask II: imaging simulations and submicron resist exposures," IEEE Trans. Electron Devices ED–31, 753–763 (1984).

H. Watanabe, H. Takenaka, Y. Todokoro, and M. Inoue, "Sub–quarter–micron gate pattern fabrication using a transparent phase shifting mask," J. Vac. Sci. Technol. B9, 3172 (1991).

H. Jinbo and Y. Yamashita, "Improvement of phase–shifter edge line mask method," Jpn. J. Appl. Phys. vol. 30, 2998–3003 (1991).

X. Chen and S. R. J. Brueck, "Imaging interferometric lithography for arbitrary patterns," Proc. SPIE 3331, Emerging Lithographic Technologies II, Y. Vladimirsky, ed., 214–22y (1998).

X. Chen and S. R. Brueck, "Imaging interferometric lithography—a wavelength division multiplex approach to extending optical lithography," J. Vac. Sci. Technol.

X. Chen, Z. Zhang, S. R. Brueck, R. A. Carpio and J. S. Petersen, "Process Development for 180–nm Structures using Interferometric Lithography and I–Line Photoresist," proc. SPIE 3048, 309–318 (1997).

S. R. J. Brueck, "Imaging interferometric lithography," Microlithography World, Winter, 2–10 (1998).

* cited by examiner

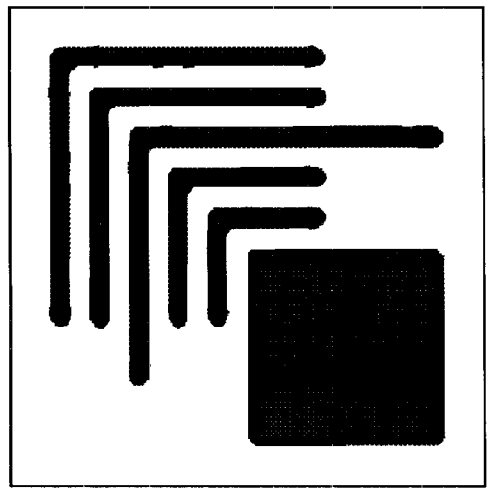
CD = 69 nm ( λ/3)
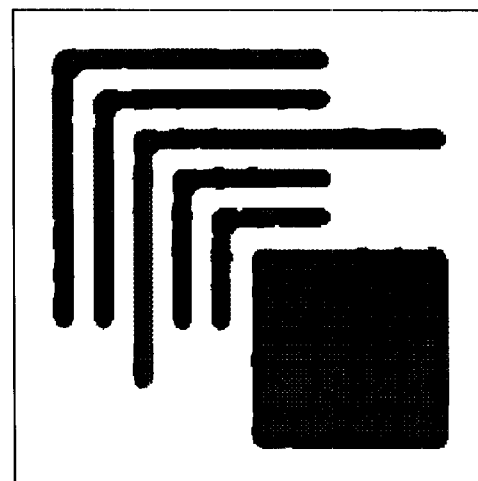
CD = 56 nm ( λ/3.4)
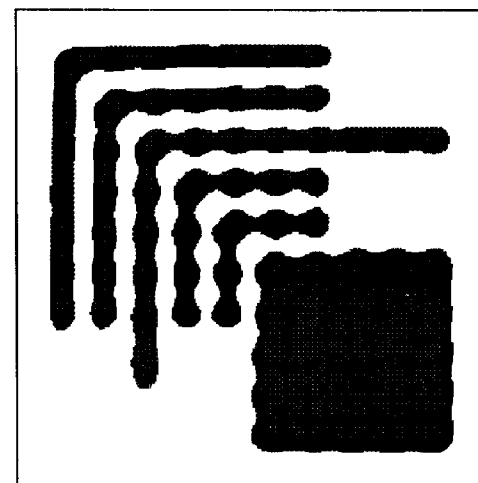
CD = 48 nm ( λ/4)
FIG. 1

Mask

Image

No OPC   OPC

Incoherent Illumination, NA = 0.65

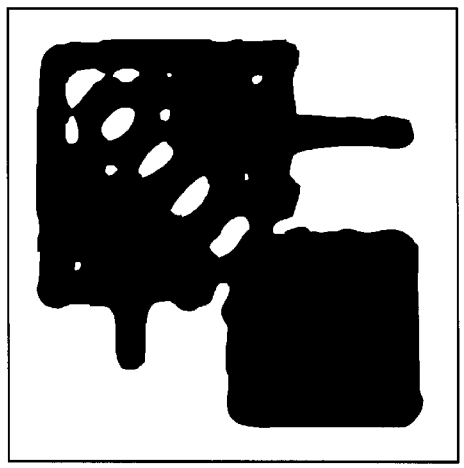
CD = 130 nm (λ/1.48)
coherent, NA = 0.65
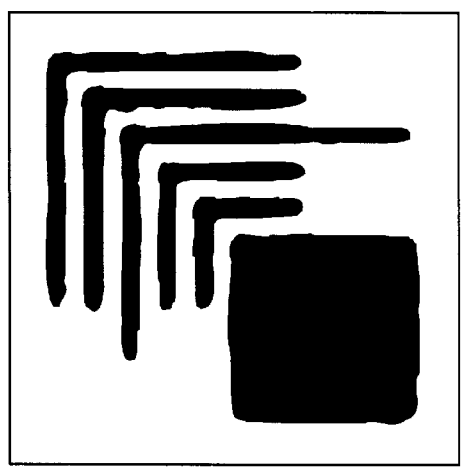
CD = 130 nm (λ/1.48), κ = 0.44
OAI @ 45°, η = 0.75, NA = 0.65
FIG. 6
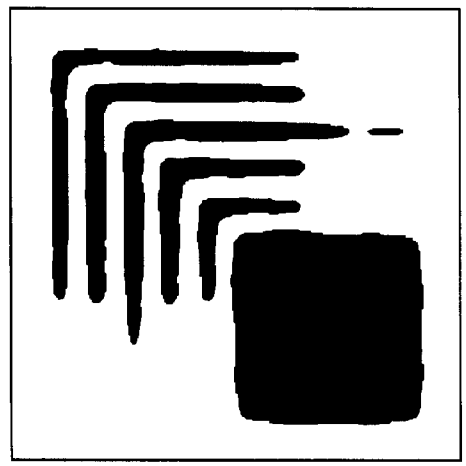
CD = 105 nm (λ/1.84), )AI @ 0°
η = 0.75, NA = 0.65, κ = 0.35
FIG. 8

CD = 85 nm ($\lambda/2.27$), )Al @ 0°
with filter $\eta = 1$, NA = 0.65, $\kappa_1$ = 0.29

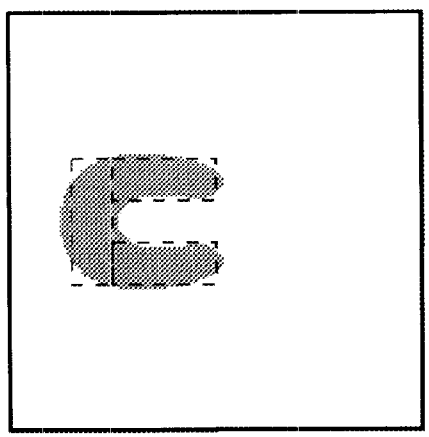
CD = 106 nm (λ/1.82), PSM
NA = 0.65
FIG. 15
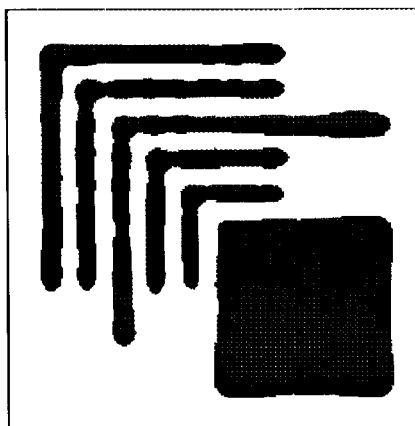
CD = 69 nm (λ/2.8), IIL
NA = 0.65, $f_{off} = f_{IL}/2$
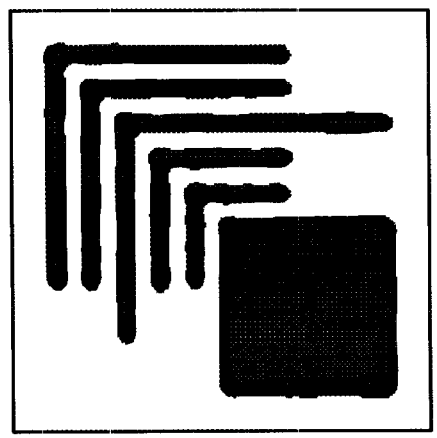
CD = 69 nm (λ/2.8), IIL with filter
NA = 0.65, $f_{off} = f_{IL}/2$
FIG. 16

CD = 79 nm ($\lambda/2.44$), IIL with filter
NA = 0.65, $f_{off} = f_{IL}/2$

CD = 69 nm ($\lambda/2.8$), IIL with filter
NA = 0.65, $f_{off} = f_{IL}/2$

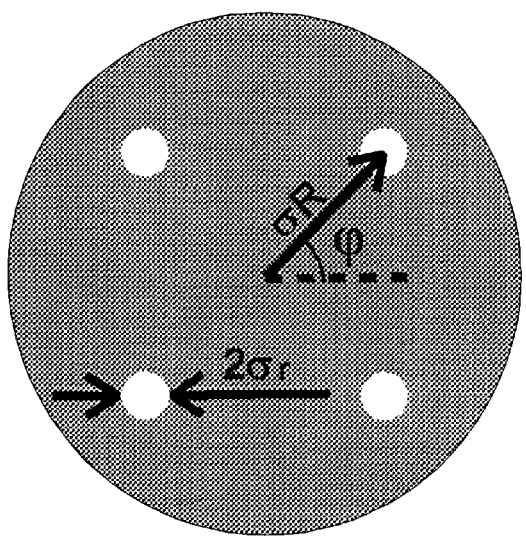
FIG. 21
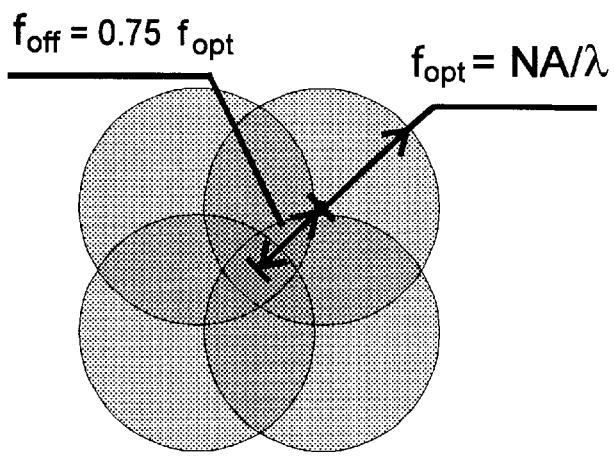
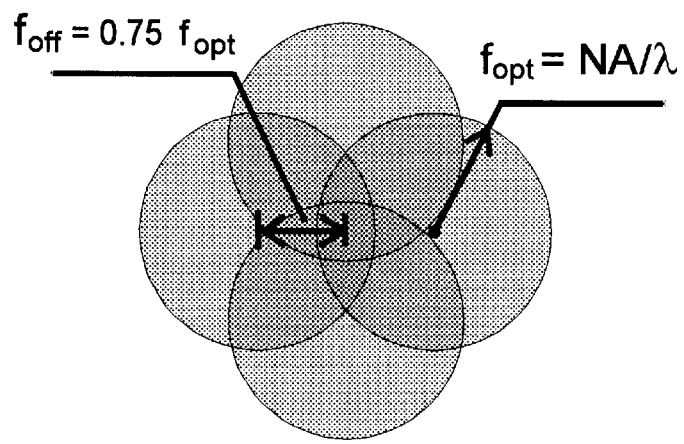
FIG. 22 y-freq.    x-freq.

Low Frequencies    High y-freq.    High x-freq.

Low Frequencies    High y-freq.    High x-freq.
NA = 0.03          NA = 0.04       NA = 0.04

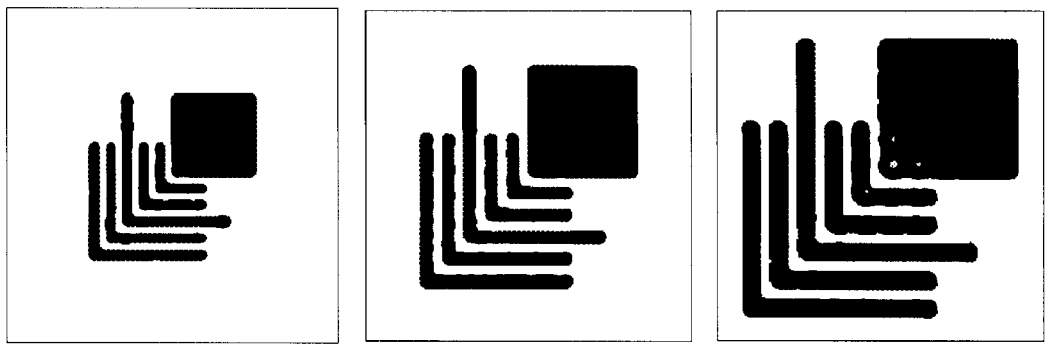
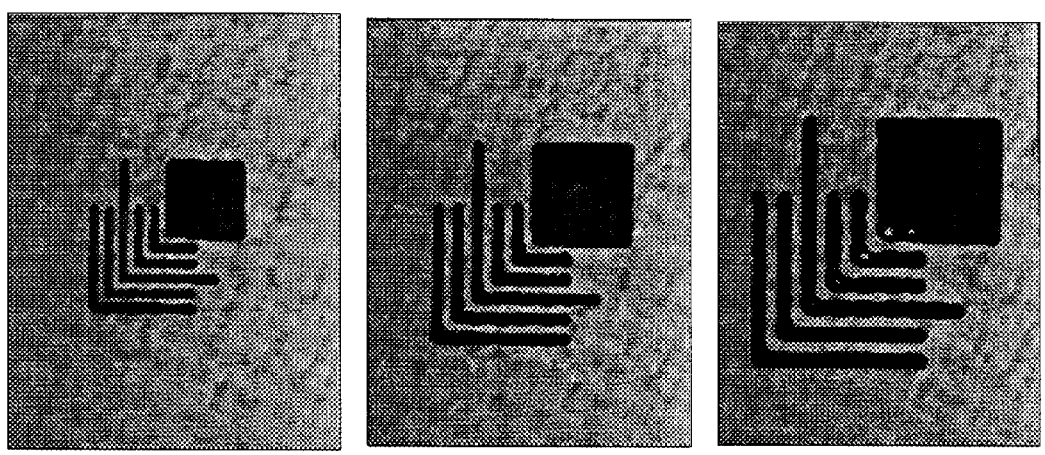
FIG. 33
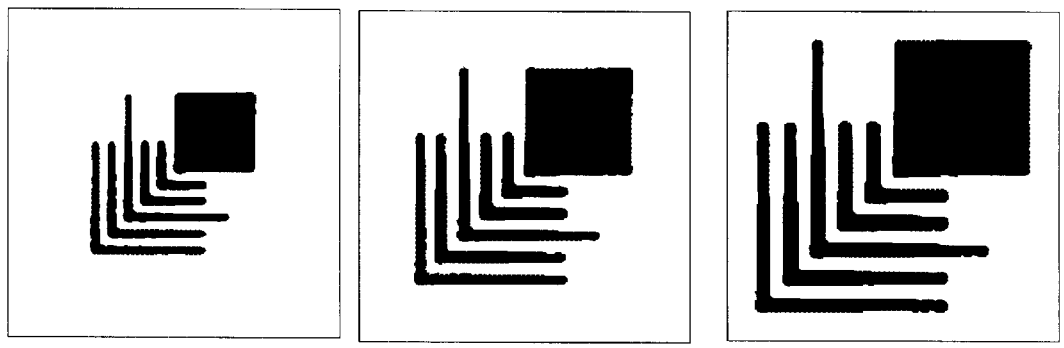
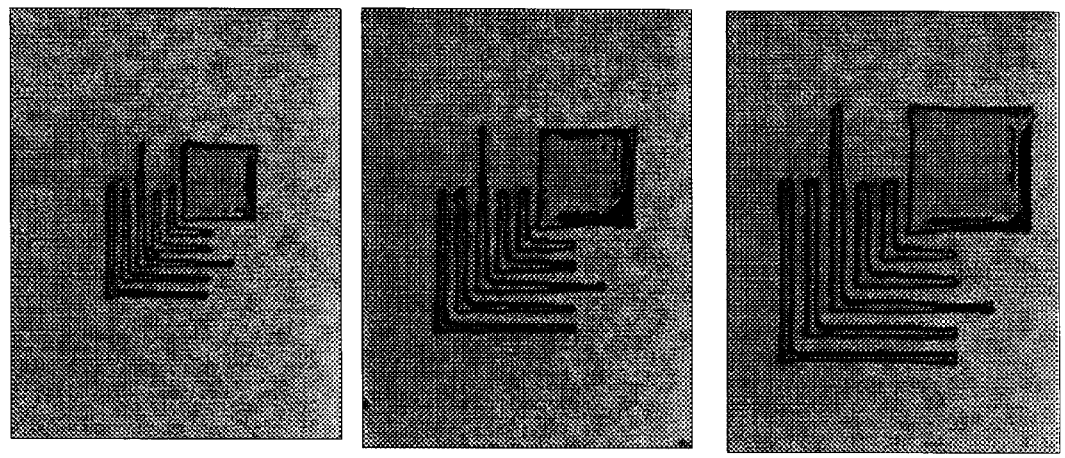
FIG. 31

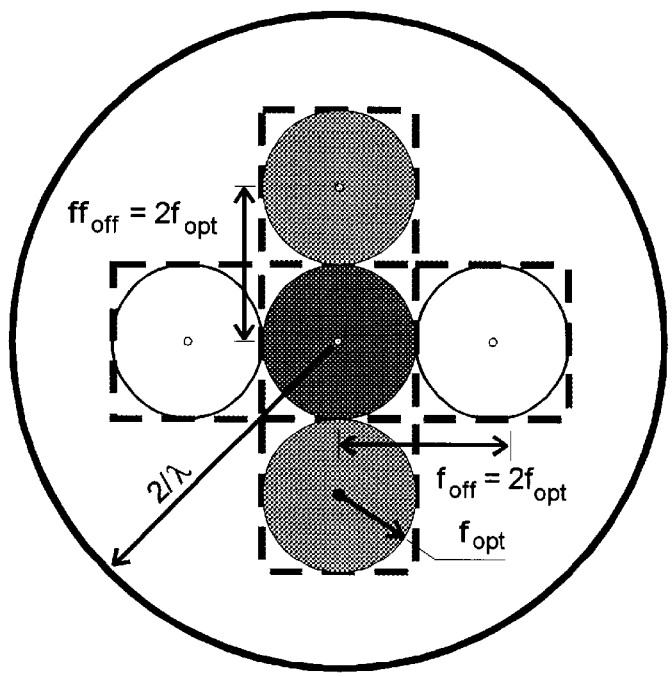

FIG. 38

| Technique | Mask Requirement | Maximum spatial frequency | Minimum $\kappa_1$ | Minimum CD for NA = 0.65 |
|---|---|---|---|---|
| Optical lithography | Binary | NA/$\lambda$ | 0.6 | $\lambda$/1.1 |
| OPC | Binary & extra sub-resolution features | (1.2-1.3) NA/$\lambda$ | 0.6 | $\lambda$/1.1 |
| OAI | Binary | 2 NA/$\lambda$ | 0.6 | $\lambda$/1.1 |
| OAI with pupil plane filters | Binary | 2 NA/$\lambda$ | 0.6 | $\lambda$/1.1 |
| PSM | 3D | 2 NA/$\lambda$ | 0.6 | $\lambda$/1.1 |
| IIL | Binary | (1+NA)/$\lambda$ to $|2/\lambda|$ | 0.23 to 0.2 | $\lambda$/2.8 to $\lambda$/3.3 |

FIG. 40

METHOD AND APPARATUS FOR IMPROVING PATTERN FIDELITY IN DIFFRACTION-LIMITED IMAGING

CROSS-REFERENCE TO RELATED APPLICATIONS

This application claims the benefit of U.S. Provisional Application No. 60/103,997 filed on Oct. 12, 1998 entitled "Pupil Plane Filters" with inventors S. R. J. Brueck and Xiaolan Chen.

GOVERNMENT RIGHTS

This invention was made in the performance of work pursuant to DARPA/Department of the NAVY Grant # N66001-96-C8617 dated May 29, 1996 for a two year term.

TECHNICAL FIELD

The present invention relates, generally, to pupil plane filters, and more particularly to the use of pupil plane filters to enhance optical imaging for both lithography and microscopy.

BACKGROUND OF THE INVENTION

The continuing goal of reducing critical dimensions (CD) in semiconductor manufacturing is putting increasing pressure on optical lithography. For further information, See "Methods and Apparatus for Integrating Optical and Interferometric Lithography to Produce Complex Patterns", Ser. No. 09/273,399, filed on Mar. 22, 1999 with inventors Brueck, et al and U.S. Provisional Application No. 60/111, 340 filed on Dec. 7, 1998 entitled "Arbitrary Lithographic Patterns" with inventors S. R. J. Brueck, Xiaolan Chen, Andrew Frauenglass and Saleem H. Zaidi. The entire contents of the foregoing are incorporated herein by reference.

The diffraction-limited resolution of optical lithography is usually expressed in a simplified form by the Rayleigh resolution criteria, viz.

$$CD = \kappa_1 \frac{\lambda}{NA} \quad (1)$$

Where $\lambda$ is the optical wavelength of the exposure, NA is the lens numerical aperture and $\kappa_1$ is related to process latitude. Throughout the development of optical lithography for semiconductor manufacturing, NAs have increased to about 0.65 and wavelengths have decreased to about 248 nm, and significant effort is being placed on a further reduction of wavelengths to 193 nm and possibly 157 nm. However, both of these trends are facing fundamental limits. For example, aberrations increase in proportion to a high power of the NA, thereby making further increases problematic. Moreover, available optical materials typically limit the wavelength for a transmissive optical system. Thus, attention has turned to reductions in $\kappa_1$.

The Rayleigh resolution criteria of Equation 1 demonstrates the frequency space constraints of an imaging optical system. Particularly, a lens is a low pass filter [J. Goodman, Introduction to Fourier Optics, 2nd edition, (McGraw Hill, New York, 1996)] with a bandwidth of $f_{opt}$=NA/$\lambda$ which results in Eq. 1. The traditional Rayleigh criterion of an intensity dip of only about 20% between two resolvable peaks results in a minimum $\kappa_1$ of 0.61. Using partially coherent illumination and high contrast photoresists, a satisfactory process latitude can be achieved at a $\kappa_1$ of 0.61 which gives a minimum CD~$\lambda$ for modern, high-NA lenses. However, it is not possible to decrease $\kappa_1$ further in conventional imaging without losing the image entirely.

The limitations on decreasing $\kappa_1$, along with the limitations on decreasing the other factors of Equation 1, have led to the exploration of a number of resolution-enhancement techniques (RET). Moreover, the high cost of enabling post-optical lithography technologies such as: x-ray; e-beam; ion-beam and extreme-ultraviolet lithography provides an incentive to extend optical lithography as far as possible. The RETs currently include, for example, optical proximity correction (OPC), off-axis illumination (OAI), phase-shift masks (PSM) and imaging-interferometric lithography (IIL). Each of these RETs improves the image quality and allows printing of lithographic features at lower $\kappa_1$. While much of the discussion and analysis of these techniques has centered on the real-space (image) implications, there is, of course, a corresponding view that emphasizes the spatial frequency content of the image. As discussed below, one embodiment of the present invention preferably takes advantage of the spatial frequency effects of some of these techniques.

For a recent review of RET, see, for example, M. D. Levenson. "Wavefront engineering from 500 mn to 100 nm CD." Proc. SPIE 3048. 2–13 (1997). L. W. Liebmann, B. Grenon, M. Lavin, S. Schomody, and T. Zell, "Optical proximity correction a first look at manufacturability," Proc. SPIE 2322, 229–238 (1994)). For further information on OPC, see, for example, P. D. Robertson, F. W. Wise, A. N. Nasr, and A. R. Neureuther, "Proximity effects and influence of nonuniform illumination in projection lithography," Proc. SPIE 334, 14 (1982), L. W. Liebmann, B. Grenon, M. Lavin, S. Schomody. and T. Zell, "Optical proximity correction, a first look at manufacturing," SPIE 2322. 14th Annual BACUS Symposium on Photo-mask Technology and Management, 229–238(1994); J. F. Chen, T. Laidig, K. E. Wampler, R. Caidwell, "Full-chip optical proximity correction with depth of focus enhancement", Microlithography World, Summer, 5–13(1997). For further information on OAI, see, for example, M. Noguchi, M. Muraki, Y. Iwasaki, and N. Magome. "Sub-half micron lithography system with phase-shifting effect," Proc. SPIE 1674, 92–104 (1992). K. Tournai, H. Tanabe, H. Nozue, and K. Kasama. "Resolution improvement with annular illumination," Proc. SPIE 1674, 753–764 (1992); K. Kamon, T. Miyamoto, Y. Myoi, H. Nagata, M. Tanaka and K. Hone, "Photolithography system using annular illumination," Jpn. J. Appi. Phys., Vol. 30, No. 1 1B. 3021–3029(1991); N. Shiraishi, S Hirukawa, Y. Takeuchi and N. Magome, "New imaging technique for 64 M-DRAM," SPIE 1674, Optical/Laser Microlithography V, 741–752(1992). For further information on PSM, see, for example, M.D. Levenson, N. S. Viswanathan, and R. A. Simpson, "Improving resolution in photolithography with a phase shifting mask," IEEE Trans. Electron Devices. ED-29, 1828–1836(1982), M. D. Levenson, D. G Goodman, S. Lindsey, P. Bayer and H. Santini, "The phase shifting mask II: imaging simulations and submicron resist exposures," IEEE Trans. Electron Devices ED-31, 753–763 (1984), H. Watanabe, H. Takenaka, Y. Todokoro, and M. lnoue, "Sub-quarter-micron gate pattern fabrication using a transparent phase shifting mask," J. Vac. Sci. Technol. B9, 3172 (1991)), H. Jinbo and Y. Yamashita, "Improvement of phase-shifter edge line mask method," Jpn. J. Appl. Phys. Vol. 30, 2998–3003(1991). For further information on IIL, see, for example, X. Chen and S. R. J. Brueck, "Imaging interferometric lithography for arbitrary patterns," Proc. SPIE 3331, 214–22y (1998). X. Chen and S. R. J. Brueck, "Imaging interferometric lithography—a wavelength division multiplex approach to extending optical lithography," J. Vac. Sci Technol. The entire contents of all of the foregoing references are incorporated herein by reference.

More particularly, the following sets forth a spatial frequency analysis of optical lithography RETs. With respect to Fourier optics, the basic goal is typically to increase the high-frequency content of the image. For a free-space optical transmission medium, the highest attainable spatial frequency is $f_{IL}=2/\lambda$, corresponding to counterpropagating plane waves at grazing incidence to the wafer. For dense features, the resulting CD is $\lambda/4$. This limit is relatively easy to approach experimentally by interferometric lithography using a small number of plane waves resulting in a repetitive pattern such as a 1D grating or a 2D dot array. See, for example, X. Chen, Z. Zhang, S. R. J. Brueck, R. A. Carpio and J. S. Petersen, "Process Development for 180-nm Structures using Interferometric Lithography and I-Line Photoresist," Proc. SPIE 3048, 309–318 (1997), which is incorporated herein by reference. Useful patterns contain a very large number of spatial frequencies, wherein corners and edges often include frequencies beyond this limiting value even for dense patterns. While imaging systems record many spatial frequencies at once, imaging systems often only record the spatial frequencies within the $\sim f_{opt}$ bandwidth of the optical system. However, RETs allow extension of this bandwidth towards $2f_{opt}$ (OPC, OAI, PSM) and to the limiting value of $f_{IL}$ (IIL).

For coherent illumination (see, for example, J. Goodman "Introduction to Fourier Optics" 2nd edition, (McGraw-Hill, New York, 1996)), the optical system passes all of the (electric field) frequency components of the diffraction with a unity coherent modulation transfer function (MTF) up to a frequency of $f_{opt}$, e.g.

$$T_{coh}(f)=1 \text{ for } f<f_{opt}$$
$$=0 \text{ for } f>f_{opt} \qquad (2)$$

The intensity aerial image contains frequencies up to $2f_{opt}$ as a result of the square-law photoresist response, but these frequencies do not necessarily correspond to findamental frequencies present in the original image. For incoherent imaging, the modulation transfer function (see, for example, J. Goodman "Introduction to Fourier Optics" 2nd edition, (McGraw-Hill, New York, 1996)) for the frequency space amplitudes is:

$$T_{inc}(f) = \frac{2}{\pi}\left[\cos^{-1}\left(\frac{f}{2f_{opt}}\right) - \frac{f}{2f_{opt}}\sqrt{1-\left(\frac{f}{2f_{opt}}\right)^2}\right] \qquad (3)$$

which extends out to $2f_{opt}$, but it decreases rapidly with $f$ and is 0.5 at $0.8 \times f_{opt}$ and only 0.04 at $1.5 \times f_{opt}$. For partially coherent illumination, which is predominantly used for manufacturing, a simple, pattern-independent expression for the MTE is not available, but the essence of these limits is retained, thus, conventional imaging provides a useable MTF only out to frequencies $\sim f_{opt}$.

Considering the foregoing explanation, a qualitative analysis of the spatial frequency basis of each of the RETs will now be set forth. For OPC (partially coherent or incoherent illumination), sub-resolution features (corresponding to high spatial frequencies) are added to the mask to boost the magnitudes of the high spatial frequencies in the Fourier transform beyond those of the image. However, adding the high spatial frequencies to the mask significantly increases the mask's complexity. The magnitudes of the high frequencies are attenuated by the optical system but are still larger than they would have been without the OPC, resulting in an image closer to the desired pattern, but no longer simply related to the mask pattern. It is intuitively clear that this approach can deal with frequencies near $f_{opt}$ where the $T_{inc}$ is $\sim 0.5$ but is inadequate to add substantial frequency content out towards $2f_{opt}$ where $T_{inc}$ is very low. Because of these restrictions in frequency space. OPC extends $\kappa_1$ to 0.5–0.4 but not below.

In OAI, the (coherent or partially coherent) illumination beam is tilted away from the optical system normal to allow higher spatial frequencies to pass through the optical system. These tilts are restricted to a fraction $\eta<1$ of $f_{opt}$ in order to transmit the zero-order beam through the optical system and the maximum spatial frequency is given by $(1+\eta)f_{opt}<2f_{opt}$. As will be shown it more detail below, there are typically significant spectral overlaps that further emphasize the lower spatial frequencies, restricting $\kappa_1$ to $\sim 0.43$. If these overlaps are eliminated, OAI can be extended to a lower $\kappa_1$.

For PSM, the mask is often drastically modified (to a 3D object) to enhance the amplitudes of the fundamental frequency components (out to $f_{opt}$) while reducing the amplitude of the dc component of the electric-field. Because of the square-law resist response, this dramatically boosts the quadratic image intensity components between $f_{opt}$ and $2f_{opt}$ allowing $\kappa_1$'s of 0.35. As was the case for OPC, the simple relationship between the mask and image pattern is lost requiring extensive design and mask fabrication efforts.

IIL is a newly introduced imaging concept that is closely related to OAI, with the major difference that the offsets are chosen beyond $f_{opt}$, requiring a separate optical system to arrange for the zero-order reference beam at the wafer. For continuous coverage along the principal $(f_x,f_y)$ frequency axes, the maximum frequency at the wafer is as high as $3f_{opt}$, allowing $\kappa_1$'s of 0.2. Additional exposures allow further extensions to the fundamental optics linear systems limit of $2/\lambda$. As with OAI, the mask and image patterns are identical (except for magnification scaling) and traditional binary chrome-on-glass masks are used.

With respect to modeling, a simple, diffraction-limited Fourier optics model serves as the basis for understanding the frequency space impacts of each of the RET techniques. The starting point is the Fourier transform of the mask function. For simplicity, a 1× magnification is assumed; this does not affect any of the conclusions, but simplifies the equations. For coherent illumination the electric field (within a scalar electromagnetic model) at the wafer is given by:

$$E(x, y) = T_{coh}(0, 0) + \sum_{f_x}\sum_{f_y} M(f_x, f_y) \times T_{coh}(f_x, f_y) e^{i2\pi f_x x} e^{i2\pi f_y y} \qquad (4)$$

where $M(f_x,f_y)$ is the Fourier transform of the mask pattern, the dc-term has been included explicitly outside of the summation and the usual normalization, $M(0,0)=1$, has been applied. Because the zero frequency term has been pulled out, the summation does not include the (0,0) term. This normalization is appropriate for all cases except for a phase shift mask with equal clear 0° and 180° areas [e.g.: $M(0, 0)=0$]. The photoresist responds to the intensity given by:

$$I(x, y) = |E(x, y)|^2 = \qquad (5)$$
$$\sum_{f_x}\sum_{f_y}[M(f_x, f_y) \times T_{coh}(f_x, f_y) \times T_{coh}(0, 0)e^{i2\pi f_x x}e^{i2\pi f_y y} + c.c.] +$$

-continued $$|T_{coh}(0,0)|^2 + \sum_{f_x}\sum_{f_y}\sum_{f'_x}\sum_{f'_y}\begin{bmatrix}M(f_x,f_y)\times M^*(f'_x,f'_y)\times T_{coh}(f_x,f_y)\times \\ T_{coh}(f'_x,f'_y)e^{i2\pi(f_x-f'_x)x}e^{i2\pi(f_y-f'_y)y}\end{bmatrix}$$

where the dc term is again excluded from the summations. Remembering that $M(f_x,f_y)$ is the Fourier transform of the mask transmission function, the first two complex-conjugate terms in Eq. (5) are the Fourier transform of the mask filtered by the optical system MTF and inverse transformed back to real space. These terms give an accurate representation of the mask pattern up to the lens cutoff frequency, $f_{opt}$. The constant term is a uniform exposure since the intensity cannot be negative. The final term, quadratic in the Fourier amplitudes, is the intensity autocorrelation of the mask image with frequencies extending to $2f_{opt}$. None of the frequency component amplitudes of this autocorrelation correspond directly (i e. linearly) to the desired image. The impact of the frequency components can be beneficial and improve the contrast. For example, for a grating structure at a pitch $f_{opt}/2<f_g<f_{opt}$, the square term at $2f_g$ adds a second-harmonic intensity component that was cutoff by the lens, but not necessarily with the same coefficient as the image transform. These terms can also be detrimental, for example, occurring at frequencies not present in the original mask transform. For compactness in what follows, the first two terms, linear in the Fourier amplitudes, will be referred to as 'linear' while the autocorrelation terms will be noted as 'quadratic.' As will be discussed in more detail below, the quadratic terms are the basis of PSM enhancements.

The mathematics is somewhat simpler for incoherent illumination (see, for example, J. Goodman "Introduction to Fourier Optics" 2nd edition, (McGraw-Hill, New York, 1996)), viz.

$$I(x,y) = 1 + \sum_{f_x}\sum_{f_y}M(f_x,f_y)\times T_{inc}(f_x,f_y)e^{i2\pi f_x x}e^{i2\pi f_y y} \quad (6)$$

The image is simply the transform of the mask multiplied by the incoherent MTF and retransformed back to real space.

The final step in evaluating the image is to evaluate the response of the photoresist to the calculated aerial image. For all of the calculations presented herein, a simple threshold function is used. The resist remains unexposed for all intensities below a threshold level and is fully exposed for intensities above this level. This is a vastly oversimplified model of actual resist behavior. However, it allows rapid calculation and keeps the focus on the optics effects. Notwithstanding this simplification, excellent qualitative agreement is obtained between the model calculations presented here and recent experiments. See, for example, X. Chen and S. R. J. Brueck, "Imaging interferometric lithography for arbitrary patterns," Proc. SPIE 3331, 214–22y (1998). X. Chen and S. R. J. Brueck, "Imaging interferometric lithography—a wavelength division multiplex approach to extending optical lithography," J. Vac. Sci Technol. (to be published).

With respect to the ideal linear systems limits of optics, the formalism of Eqs. 4 and 5 provides a simple way to evaluate this limit. As noted above, the linear terms contain the pattern information. FIG. 1 shows a simple calculation of the limiting optics capability including all of the linear terms up to the $f_{IL}$ free-space optics bandwidth limit and ignoring the quadratic contributions for a test pattern including a series of five nested "ells" with both dense and isolated features as well as a large feature included to ensure a wide range of spatial frequencies. All of the calculations presented are for a 193-nm exposure wavelength. Straightforward wavelength scaling increases these CDs by a factor of 1.9 for i-line and decreases them by 0.81 for a 157-nm exposure wavelength. The figure shows an area of 24×24 CD; the actual pattern, which is identical to that used in the experiments reported elsewhere (see, for example, X. Chen and S. R. J. Brueck, "Imaging interferometric lithography for arbitrary patterns," Proc. SPIE 3331, 214–22y (1998)), repeats on a larger grid of 40×40 $CD^2$ to ensure an adequate sampling of frequency space. The modeled image is a good realization of the desired pattern for a CD of 69 nm (/2.8) with only some rounding of the nominally square line ends showing the impact of the frequency limits of the transmission medium. At a CD of 56 nm (/3.5), some linewidth variation and a dense-isolated line bias is evident. At a CD of 48 nm (/4), the pattern has developed the strong linewidth fluctuations that are characteristic of a coherent illumination exposure just at the frequency cut-off where the fundamental frequency (½CD) of the line-space pattern is transmitted, but the higher frequencies necessary to define the edges and comers of the pattern are eliminated by the bandwidth constraint. The definition of the corners of the 'ells' is also impacted and a hole has appeared in the upper left corner of the large box. The required high-spatial frequency coverage is roughly given by ellipses centered around ±½CD with a halfwidth of (½nCD) where n is the number of nested lines (5 in this case) along the frequency axis and a halfwidth of ¼L where L is the length of the line in the direction perpendicular to the frequency axis. Based on this qualitative calculation, the minimum CD for the present pattern at a 193-nm exposure wavelength is 58 nm ~/3.3 in good agreement with the detailed modeling. The small-scale jagged edges on the figures are an artifact of the pixelization of the calculation (CD/12). It is stressed that this calculation is only intended to set a standard with which to compare the capabilities of the optical enhancement techniques. As such, there is no physical optical system associated with the calculation and no way to eliminate the quadratic terms in a real experiment. Nevertheless, as shown below, the model calculations approach this idealized limit quite closely showing that there is a potential to extend optical lithography well beyond its current implementations.

With respect to optical proximity correction (OPC), the basic idea is to add sub-resolution features to boost the amplitudes of the high frequency image components so that after the attenuation of the optical system, the high frequency components are closer to required levels. FIG. 2 shows a simple example for 193-nm incoherent illumination with a 0.65 NA optical system and a 132-nm CD ($\kappa_1$=0.44). The top left panel shows the non-OPC mask pattern. It is modeled as repetitive in both the x- and y-directions with a period of the outline of the large box. This makes the summations discrete and limited to a small number of frequencies enabling rapid image calculations. The bottom left shows the printed image using the uncorrected mask. There is significant rounding of all of the corners and foreshortening of the isolated lines. The top right panel shows a mask pattern with an empirically derived OPC including line extensions (nailheads) for outside corners and missing areas (mouse bites) for inside corners. Note that the OPC adds significantly to the mask complexity. The impacts of these changes extend for a scale of $\sim\lambda$ on the image, making the corrections nonlocal and requiring considerable design and computation to settle on an optimum correction.

Finally, the bottom right panel shows a modeled image with OPC that is much closer to the desired pattern.

Figure 3:
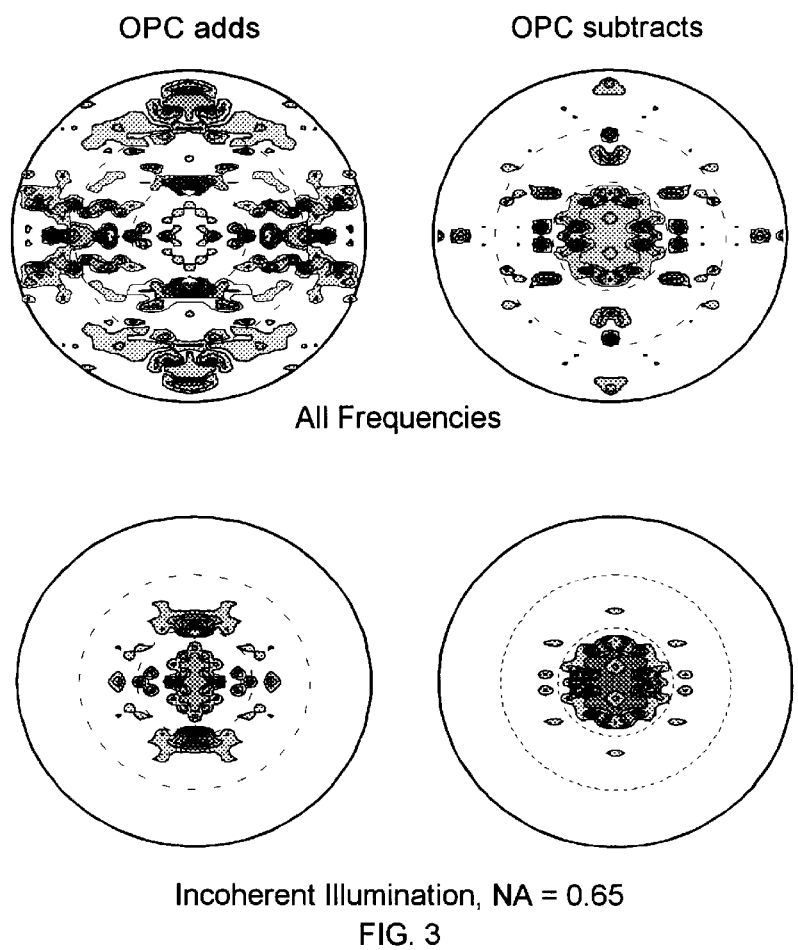

The impacts of OPC in frequency space are shown in FIG. 3. The top panels show the positive (left) and negative (right) differences between the amplitude Fourier transforms of the OPC and the uncorrected masks just at the mask plane. The large circle represents the $f_{IL}$ limit of optics. The two dotted circles are at radii of $f_{opt}$ (corresponding to the maximum frequency covered in the linear terms) and $2f_{opt}$ (indicating the maximum frequency available from the quadratic terms). This convention will be retained for all subsequent frequency-space illustrations. Note that the sub-resolution OPC adds spectral intensity all the way out to $f_{IL}$. The bottom panels show similar plots for the amplitude Fourier transforms of the aerial image at the wafer plane. The optical system MTF eliminates the high frequency components and limits the changes in the final image to just beyond $f_{opt}$. This frequency restriction limits the possible improvement over conventional photolithography.

As such, OPC is applicable for incoherent or partially coherent illumination. The coherent illumination MTF already passes all of the frequency components up to $f_{opt}$, with a unity transfer function and eliminates all of the components above $f_{opt}$. Adding frequency components above $f_{opt}$ with OPC has no impact on the final image for coherent illumination.

With respect to off-axis illumination (OAI), numerous variants on off-axis illumination have been investigated (For a recent review, see M. D. Levenson. "Wavefront engineering from 500 nm to 100 nm CD." Proc. SPIE 3048. 2–13 (1997)). In general, for Manhattan geometry patterns, quadrupole illumination is preferred. The three parameters that define the geometry for hard quadrupole apertures are the offset angle, the orientation of the quadrupole relative to the pattern x-axis and the diameter of the aperture (the partial coherence). For small aperture diameters relative to the offset angle, the quadrupole illumination is equivalent to an incoherent summation over four independent off-axis, coherent illumination exposures. This is the simplest configuration that retains the essential physics of the off-axis illumination and is most closely related to IIL. This analysis will be restricted to this simple, limiting case.

Equations 4 and 5 must be modified to account for the off-axis illumination. For each exposure, they become:

$$E(x, y) = T_{coh}(-f_{off}\cos\varphi, -f_{off}\sin\varphi)e^{-i2\pi f_{off}[x\cos\varphi+y\sin\varphi]} + \sum_{f_x}\sum_{f_y} \frac{M(f_x, f_y) \times}{T_{coh}(f_x - f_{off}\cos\varphi, f_y - f_{off}\sin\varphi)} e^{i2\pi(f_x-f_{off}\cos\varphi)x} e^{i2\pi(f_y-f_{off}\sin\varphi)y} \quad (7)$$

and $$I(x, y) = \sum_{f_x}\sum_{f_y}\left[\begin{array}{l} M(f_x, f_y) \times T_{coh}(f_x - f_{off}\cos\varphi, f_y - f_{off}\sin\varphi) \times \\ T_{coh}(-f_{off}\cos\varphi, -f_{off}\sin\varphi)e^{i2\pi f_x x}e^{i2\pi f_y y} + c.c. \end{array}\right] + \quad (8)$$

$$|T_{coh}(-f_{off}\cos\varphi, -f_{off}\sin\varphi)|^2 +$$

$$\sum_{f_x}\sum_{f_y}\sum_{f'_x}\sum_{f'_y}\left[\begin{array}{l} M(f_x, f_y) \times M^*(f'_x, f'_y) \times \\ T_{coh}(f_x - f_{off}\cos\varphi, f_y - f_{off}\sin\varphi) \times \\ T_{coh}(f'_x - f_{off}\cos\varphi, f'_y - f_{off}\sin\varphi)e^{i2\pi(f_x-f'_x)x}e^{i2\pi(f_y-f'_y)y} \end{array}\right]$$

where $f_{off}=\eta f_{opt}$ is the offset spatial frequency which is necessarily less than $f_{opt}$ and $\sigma$ is the orientation of the particular hole of the quadrupole relative to the pattern x-axis. The first term in Eq. 7 is the zero-order diffraction (transmission) shifted because of the off-axis illumination. The same shift occurs in all of the other diffracted orders as well. Since the offset appears in the argument of the MTF the region of frequency space covered is shifted from the origin. As the offset is the same for all spatial frequencies, it is eliminated from the exponential terms on squaring to the intensity and the only impact is through the MTF functions. Because a real image must have a complex conjugate relationship between frequency terms reflected through the origin (cf. Eq. 8) each exposure covers two circles in spatial frequency space of radius $f_{opt}$ and centered along the offset direction at $\pm f_{off}$. These circles are overlapped in the vicinity of the origin out to frequencies of $\pm(1-\eta)f_{opt}$ along the offset direction. The opposing hole ($\sigma \rightarrow \sigma+\pi$) of the quadrupole gives the identical result for the intensity and serves primarily to preserve the telecentricity of the exposure without adding any additional image information at focus. The remaining two holes give patterns with the offset along an orthogonal axis.

Figure 4:
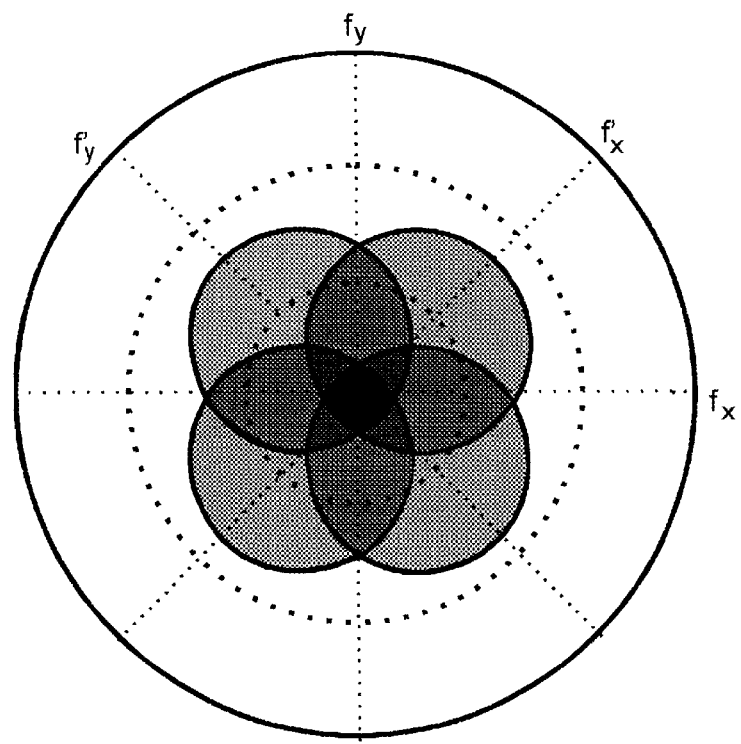

FIG. 4 shows the final frequency space coverage. There are spatial frequency regions, clustered at low frequency, where the same spectral intensities are covered in multiple exposures. This overlap leads to a frequency dependent MTF and results in a roll-off in the MTF towards higher frequencies. The density of the fill in each region of FIG. 4 is proportional to the MTF in that region. The highest MTF occurs at the frequency space origin where all four exposures contribute to the image frequency components. The axes labeled $f_x$ ($f_y$) correspond to a /4 rotation of the quadrupole relative to the pattern x (y) axes. Along this direction the overlap decreases from four circles to two circles (MTF→0.5) at a frequency $f_1$ and drops to no coverage (MTF→0) at a frequency $f_2$. Similarly, along the axes labeled $f_{x'}$ ($f_{y'}$) corresponding to alignment of the quadrupole axes with the pattern axes, the coverage drops to three circles $f_{1'}$ (MTF→0.75), to one circle at $f_{2'}$ (MTF→0.25) and to no coverage (MTF→0) at $f_{3'}$. In terms of and $f_{opt}$ these frequencies are given by:

$$f_1 = \left(\sqrt{1-\frac{\eta^2}{2}} - \frac{\eta}{\sqrt{2}}\right)f_{opt} \ldots f_2 = \quad (9)$$

-continued $$\left(\sqrt{1-\frac{\eta^2}{2}}+\frac{\eta}{\sqrt{2}}\right)f_{opt}\ldots \begin{array}{l}f_1'=(1-\eta)f_{opt}\\ f_2'=\sqrt{1-\eta^2}\,f_{opt}\\ f_3'=(1+\eta)f_{opt}\end{array}$$

Figure 5:
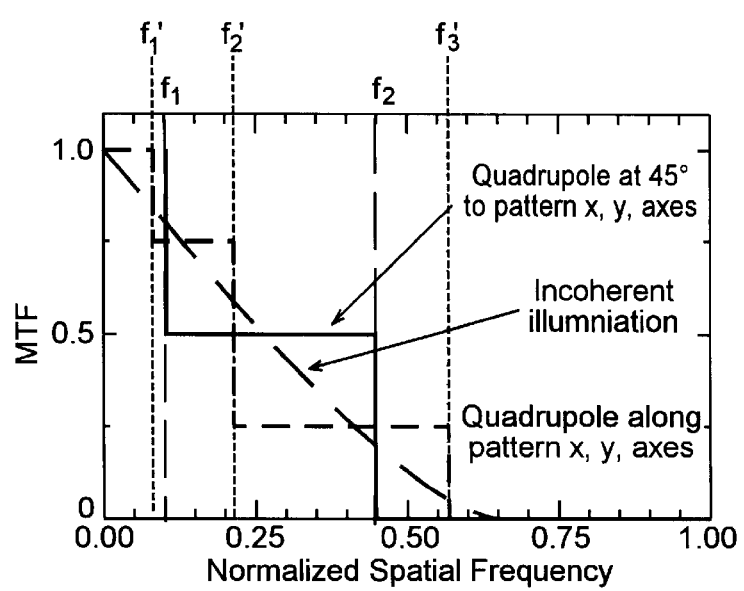

The contribution to the MTF from only the first two ('linear') terms in Eq. 8 along both the $f_x$ and $f_{x'}$ axes is plotted in FIG. 5 along with the MTF of an incoherent exposure for reference. It is worth noting that the decrease in the incoherent MTF arises from a very similar effect of multiple counting in frequency space. Incoherent illumination can be evaluated as a summation over many independent coherent illumination exposures covering all possible incident azimuthal and polar angles, each exposure covers a pair of circles in frequency space, with appropriate cutoffs for frequencies beyond the lens numerical aperture. The derivation of the incoherent MTF, Eq. 3, involves integrating over these multiple exposures in much the same way that result of FIG. 5 was obtained. The results of FIG. 5 are in excellent agreement with a much more detailed calculation, including effects of partial coherence and defocus, by Tounai et al. (K Tournai, H. Tanabe, H. Nozue, and K. Kasama "resolution improvement with annular illumination," Proc. SPIE 1674, 753–764 (1992)).

The quadratic terms also impact the final image. Thus, it is not possible to derive an image-independent, intensity MTF including both the linear and quadratic terms for the case of coherent illumination. Using spatial filters, there are many non-unique ways to "tile" frequency space, i.e. to eliminate these overlaps and assure that the linear terms are counted equivalently out to the limits of the pattern. However, these tilings have different quadratic terms and this can significantly impact the final printed pattern as will be discussed in more detail below.

Inspection of FIGS. 4 and 5 immediately illuminates the tradeoffs involved in rotation of the quadrupole relative to the pattern axes. For a 45° rotation ($f_x, f_y$), the MTF has dropped less dramatically at moderate spatial frequencies (0.5 at $f_{opt}$) compared with a 0° rotation ($f_{x'}, f_{y'}$) where the MTF is only 0.25 at $f_{opt}$, but it does not extend as far in frequency space. As→1, $f_2$→/2$f_{opt}$ while $f_{3'}$→2$f_{opt}$. These differences have important impacts on the lithographic capability as the CD is decreased, requiring higher spatial frequencies to define the image.

FIG. 6 shows the real-space modeling results for printing the same test pattern that was used to evaluate the ideal optics limits at a CD of 130 nm using a 193-nm exposure and an NA=0.65 optical system ($_1$=0.44). The top panel is the result of a conventional, normal incidence illumination, coherent exposure. The high spatial frequencies that define the dense line-space pairs are not transmitted by the optical system and the resulting image has merged into a single amorphous feature. The bottom panel shows the result of a quadrupole OAI exposure =0.75 and =45°. The line-space pairs are now well resolved and, except for some dense/isolated bias (the horizontal and vertical isolated lines are narrower than the dense lines) and rounding of the sharp comers, the pattern is captured faithfully.

Figure 7:
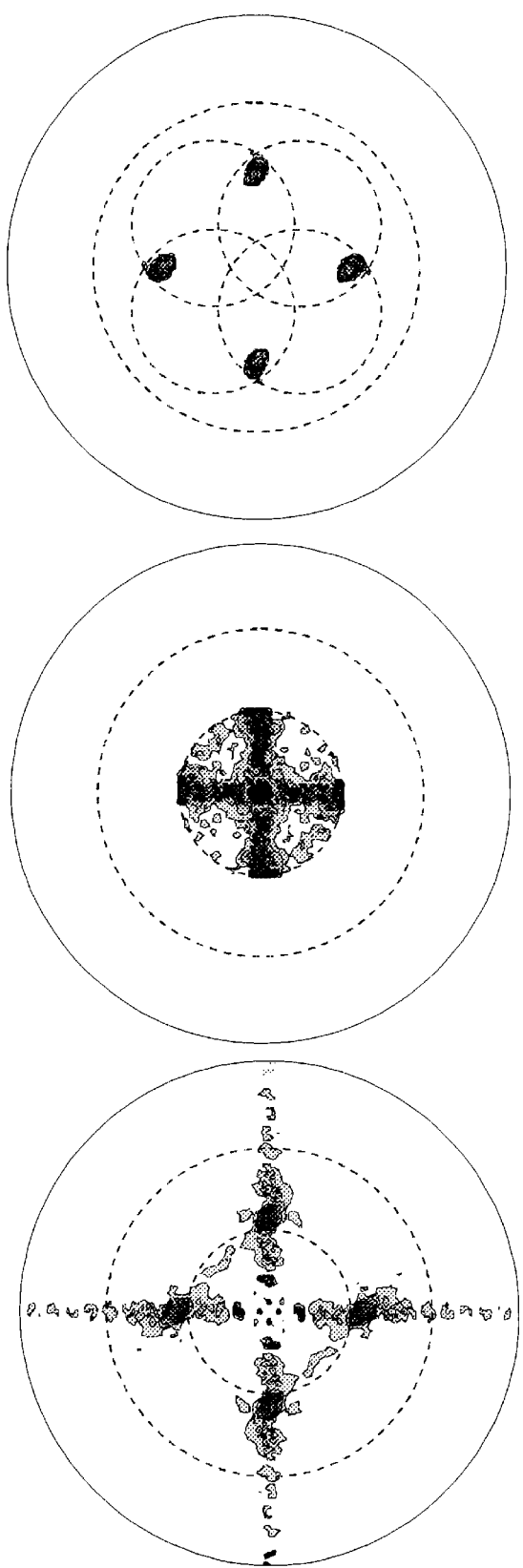

FIG. 7 shows frequency space views of these exposures. It is easier to interpret spectral differences rather than to compare the full spectra. The top panel shows the spectral intensities added by OAI. As expected, the added features are concentrated around 1/(2CD) in both the $f_x$ and $f_y$ directions. The middle panel of FIG. 7 shows the spectral intensities suppressed by OAI compared with conventional OL. These are all <$f_{opt}$. The distribution of spatial frequency content along the $f_x$ and $f_y$ axes is evident. Finally, the bottom panel shows the difference between the ideal linear systems limit of optics and the OAI exposure. Significant additional spectral intensity is needed around the fundamental frequency [1/(2CD)] of the line-space pattern. The impact of this decrease in intensity is both in the details of the pattern as can be seen in FIG. 6 and in the process latitude. The calculated aerial images clearly show substantial differences in process latitude (i.e. in the depth of the intensity modulation between lines and spaces) for the various exposure strategies. This is the limit to the dense CD that can be printed in this optical configuration. For smaller CDs important frequency components are lost as the effective MTF→0 as shown in FIGS. 4 and 5. It is useful to make this limit somewhat quantitative. The maximum spatial frequency covered along the principal axes is $f_2$ (0.75)=1.38$f_{opt}$. As discussed above, the maximum spatial frequency required is ~1.2×[1/(2CD)], giving a minimum CD of ~129 nm for a 193-nm exposure in this off-axis configuration.

Figure 9:
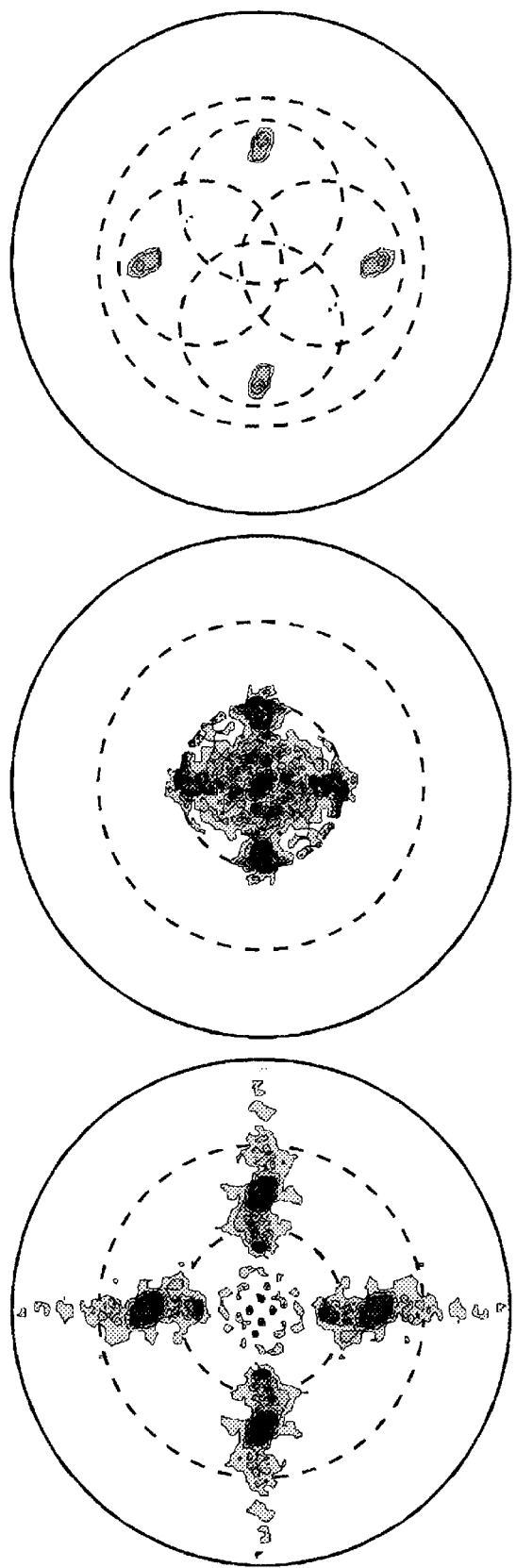

FIGS. 8 and 9 show comparable real-space and frequency-space views for the same pattern and optical system with a smaller CD of 105 nm, =0.75 and σ=0° ($_1$ of 0.35). The smaller CD could be resolved because of the greater frequency coverage of the 0° geometry. However, the dense-isolated line bias is much more pronounced with the longer horizontal isolated line even being broken; there is also some distortion of the large box. The reasons for these effects are evident in the frequency space plots. The frequencies added by OAI are further out in frequency space, corresponding to the smaller CD, but the intensities added (number of contours) are weaker because of the lower effective MTF. Similarly, the bottom panel that shows the spectral additions necessary to get to the limit of optics are much more pronounced than for the 45° case. Here again, a very simple calculation serves to evaluate the minimum dense CD that can be printed in this geometry. The calculation is identical to that above with f3'( )→1.75 replacing $f_2$ giving ~102 nm at a 193-nm exposure wavelength.

With respect to phase-shift masks (PSM), many variations of phase-shift masks have been introduced (For a recent review, see M. D. Levenson. "Wavefront engineering from 500 nm to 100 nm CD." Proc. SPIE 3048. 2–13 (1997)) including strong (alternating aperture) and weak (attenuated phase-shift). For the purposes of this discussion, a simple chromeless phase-shift mask will be used to illustrate the frequency space impacts of phase shift masks. For many patterns, a chromeless phase-shift mask introduces extra pattern lines which require a second elimination exposure. The basic idea of the phase-shift mask is understood simply by reference to Eqs. 4 and 5. The phase shift enhances the relative magnitudes of the non-dc Fourier coefficients and, hence, the linear terms, but the increase in the quadratic terms is much greater emphasizing these high frequency contributions to the final image.

Figure 13:
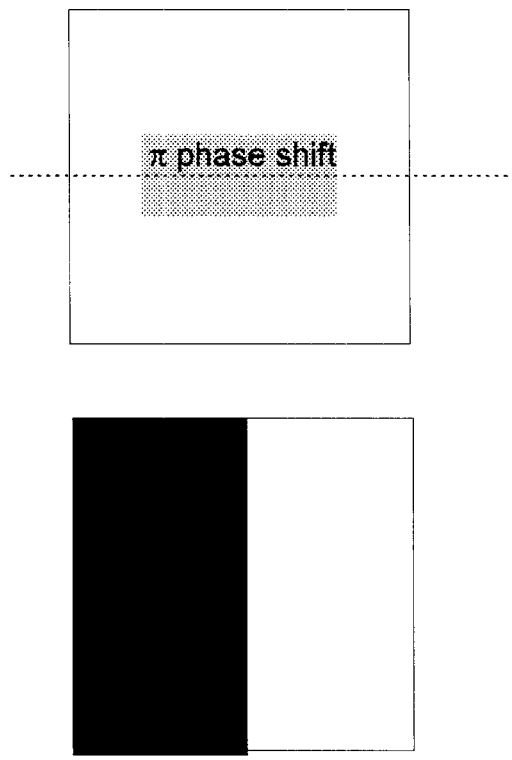
Figure 14:
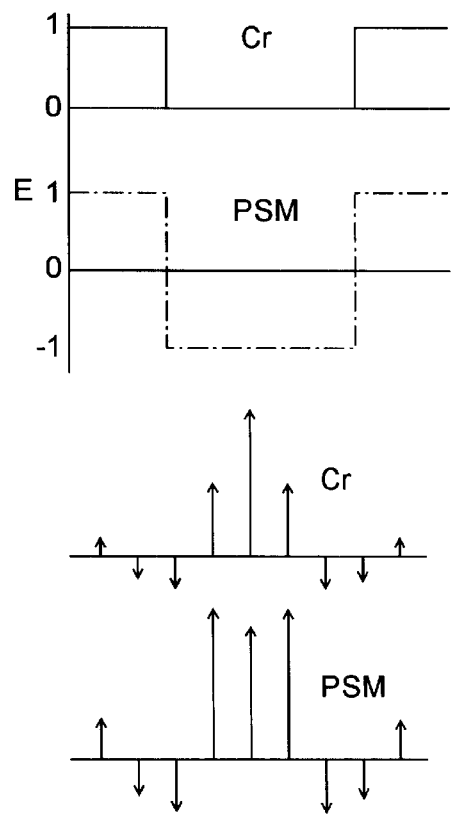

FIG. 13 shows the simple mask set used for the modeling. The goal is to print a "u" shape with arms at the CD and separated by a CD. The two masks consist of a phase-shift mask with a phase shift in a rectangular region 2.5 CD high that prints the outline of the rectangle, and a conventional, binary chrome-on-glass mask to eliminate the second half of the rectangle leaving the "u". Again, these are taken as repetitive patterns with repeat lengths given by the boxes containing the masks. FIG. 14 shows the electric field strength immediately following the phase-shift mask along the cut indicated by the dotted line in FIG. 13. Two curves are shown. The dash-dot curve (PSM) corresponds to the phase-shift mask. The solid curve (Cr) is the field profile for a conventional chrome-on-glass mask of the same shape for reference. Since both curves are simple square waves, the Fourier transforms are both sinc functions, sampled at the $f_x$- and $f_y$-frequencies defined by the periodicity. Two impacts of the phase shift are immediately evident. The field variation for the phase shift mask (1 to −1) is twice as large as that for the conventional mask (1 to 0) doubling the Fourier magnitudes, and the dc Fourier coefficient, corresponding to the integral over the field, is smaller for the phase shift mask because of the negative field in the phase shift region. Combined, these two effects strongly increase the importance of the quadratic terms in the imaging (Eq. 8). For this example, one skilled in the art will appreciate that all of the non-zero frequency terms are increased by 2.2 (normalized to $M_{00}$=1), and, of course, the quadratic coefficients are increased by $2.2^2$=48.

FIG. 15 shows the printed pattern modeled for a CD of 106 nm using a coherent exposure with a NA=0.65 lens at a 193-nm exposure wavelength ($\kappa_1$=0.36). The extra high-frequency content results in printing the outline of the rectangle. The right-hand side of the rectangle was eliminated with a second blocking exposure. The rounding of the pattern corners results since the linear frequencies that define the corner for a conventional exposure are eliminated by the optical system, hence the quadratic frequencies that give the outline are also eliminated. Based on this modeling, $\kappa_1$ of ~0.4–0.35 are possible using phase-shift techniques.

With respect to imaging interferometric lithography (IIL), IIL introduces a zero-order diffraction at the wafer plane. In contrast, the OAI offset angles are constrained to be within the lens NA. The reason for this constraint is clear from Eq. 8, if the offset were to be set outside of the NA, the zero-order diffraction would not be transmitted by the optical system $[T_{coh}(-f_{off}\cos\sigma,-f_{off}\sin\sigma)\rightarrow 0]$ and the linear terms in. the intensity vanish leaving only the quadratic terms. As noted above, the principal image information is in these linear terms, so that OAI with a conventional mask is simply not possible at $f_{off} > f_{opt}$. IIL resolves this issue by introducing a second beam path around the optical system to reintroduce the zero-order diffraction at the wafer plane. This allows much larger offset angles, and, thereby, much larger spatial frequencies, resulting in smaller CDs or, equivalently, smaller $\kappa_1$s. For a telecentric lens geometry, where the mask and wafer planes are necessarily normal to the optical axis, the maximum offset angle is grazing incidence ($f_{off}\rightarrow 1/\lambda$), giving a maximum spatial frequency of (1+NA)/$\lambda$ for NA>0.5 or $^{3NA}/\lambda$ for NA α 0.5 compared with $\sqrt{2}$NA/$\lambda$ (at $\eta$=1, $\sigma$=45°) or 2NA/$\lambda$ (at $\eta$=1, $\sigma$=0°) for OAI. As in the case of OAI, telecentricity of the entire optical system (as opposed to just the imaging lens) can be recovered at the expense of additional optical complexity by introducing a second, incoherently-related, reference from the opposing side. Just as is the case for OAI, the multiple exposures can be simultaneous as long as the incident beams are incoherent, for example using multiple, independent laser sources. For tilted mask and wafer geometries, the ultimate linear systems frequency limit of optics $f_{IL}$=2/$\lambda$ can be reached. However, the extra difficulty of non-telecentric lenses and imaging systems probably makes this a less desirable alternative, at least for initial applications.

A time-domain communications analogy, wavelength division multiplexing (WDM), provides additional perspectives on the physics of IIL. WDM is used when the available bandwidth of a transmission medium (e.g. free-space or an optical fiber) is much larger than the electronic systems bandwidth used for modulating and demodulating the signal. Multiple frequency- (or wavelength-) offset carriers can then carry independent data streams. Modulation and demodulation for each data stream is accomplished by nonlinear mixing. The entire data stream can be reassembled after the multiple, independent transmissions. For IIL a very similar process occurs in space rather than in time. The ultimate bandwidth of optics is $f_{IL}$, the optical system limits the bandwidth for a single transmission to $f_{opt}$=NA$\equiv\lfloor <<f_{IL}$. The square-law conversions from intensity to electric field and back provide the nonlinear mixing. Off-axis illumination down-shifts the spatial frequencies within a specific area of frequency space into the optical system bandwidth and the interference with the reference beam resets the spatial frequencies after the optical system. Only a single-sideband is collected by the lens, the nonlinear mixing restores both sidebands around the (DC) image carrier frequency. The photoresist accumulates the total image information from the multiple exposures.

In summary, nonlinear processes can further extend the frequency space available to optics. As a trivial example, the aerial image for simple two-beam interference is 1+cos(4π sin θ/λ). After the nonlinear development step, square patterns with nearly vertical sidewalls are formed with a Fourier decomposition of $$\sum_n \frac{\sin(\pi n \xi)}{\pi n \xi} e^{\frac{i4\pi n \sin\theta}{\lambda}x}$$

where $\xi\lambda/(2\sin\theta)$ is the linewidth and $\lambda/(2\sin\theta)$ is the period. This extends to much higher frequencies (n>1) than does the aerial image. As demonstrated by the modeling, the linear systems limits of optics, which can be reached by the various RETs, extend well beyond today's practical limits. Optimization of the lithographic response and use of nonlinear processes will further extend the practical scales for optical techniques. There is substantial mileage remaining to allow further reductions in scale while still maintaining the parallel processing and manufacturing capability that have made optics the dominant lithographic manufacturing technique.

SUMMARY OF THE INVENTION

The present invention involves the use of pupil plane filters to enhance optical imaging for both lithography and microscopy. The present invention includes numerous pupil plane filter strategies for enhancing optical lithography. A square pupil plane filter suitably restricts the imaging to a nearly diffraction limited regime. Moreover, pupil plane filters are suitably used in off-axis illumination (OAI) and imaging interferometric lithography (ILL). Simple binary filters, e.g., either 0% or 100% transmission, are used to reduce spectral overlap between different exposures; however, further improvement in the image quality is achieved by using filters with a continuous variation in transmission between these limits. The techniques of OAI and ILL along with the use of pupil-plane filters are applicable in, for example, any diffraction-limited situation where the limit is imposed by the characteristics of the optical system rather than the transmission medium and where the illumination system is under the control of the experimenter. The present invention not only applies to imaging with electromagnetic waves, the present invention also applies to improving the imaging properties of acoustic imaging schemes, electron beam imaging (for example, SEM, IBM, etc.) and ion-beam imaging.

BRIEF DESCRIPTION OF THE DRAWING FIGURES

The present invention will hereinafter be described in conjunction with the appended drawing figures, wherein like designations denote like elements, and:

FIG. 1: Model calculations of the frequency space limits of optics. Only the 'linear' terms of Eq. 5 have been included. The pattern fidelity degrades as the CD decreases as a result of the (2/λ) free-space propagation bandwidth limit. All of the simulations presented in this paper are for a 193-nm exposure wavelength and scale linearly with the exposure wavelength.

FIG. 2: Simulation of OPC. The top panel shows the mask corresponding to the desired pattern (left) and an OPC version (right). Additional mask features have been added (black) to outside corners and removed (white) from inside corners. The bottom panel shows the resulting printed patterns for a pattern CD of 132 imi and a incoherent illumination 193-nm exposure with a NA=0.65 optical system ($\kappa_1$=0.44). The pattern without OPC shows foreshortening of the lines, significant edge rounding and distortion of the inside corners, all of which are improved with the use of OPC.

FIG. 3: Frequency space picture corresponding to the exposure of FIG. 2. The top panels show the difference between the intensity Fourier transform of the OPC aerial image and that of the normal pattern just at the mask plane. The OPC results in added spectral intensity at frequencies extending out to the 2/λ limit of optics as well as decreasing some of the spectral intensities, primarily about $f_{opt}$. The bottom panels show the same difference spectra at the wafer plane. The MTF of the optical system restricts the changes to frequencies $\leq f_{opt}$.

FIG. 4: Frequency space coverage for a quadrupole OAI drawn for NA=0.65 and $\eta = f_{off}/f_{opt}$=0.75 in the limit of very small partial coherence. The f'x (f'y) axes correspond to orienting the quadrupole along the pattern x (y) axes while the $f_x$ ($f_y$) axes are for the quadrupole oriented at 45° to the x (y) axes. Areas of multiple coverage are indicated by a darker shading.

FIG. 5: Effective MTF for the linear imaging terms in OAI corresponding to the two most common quadrupole orientations. For a 45° orientation, the MTF is higher at intermediate frequencies ($\sim f_{opt}$ than for a 0° orientation, but has a lower cutoff frequency. The incoherent MTF is also shown for reference.

FIG. 6: Model calculation test pattern images at a CD of 130 nm with NA=0.65 ($\kappa_1$0.44). The top panel is for a conventional coherent-illumination exposure where the pattern is unresolved. The bottom panel shows the results of off-axis illumination with $\eta$=0.75 and θ=45°. All of the pattern features are resolved, but there is some dense-isolated line bias evident in the thinner isolated lines.

FIG. 7: Frequency space interpretation of OAI for the exposure of FIG. 6. The top and middle panels give the positive and negative differences between the intensity Fourier transforms of the OAI and the coherent illumination aerial images. The OAI emphasizes the high frequency spectral content that was missing from the coherent-illumination image. The bottom panel shows the remaining difference between the ideal and the OAI intensity transforms.

FIG. 8: Model calculation test pattern images at a CD of 105 nm with NA=0.65 ($\kappa_1$=0.35) for OAI with $\eta$=0.75 and θ=0°. Higher spatial frequencies are covered as compared with the 45° orientation, but the lower MTF leads to a more pronounced dense-isolated line bias and distortion of the large box.

FIG. 9: Frequency space interpretation of OAI for the exposure of FIG. 8. The top and middle panels give the positive and negative differences between the intensity Fourier transforms of the OAI and the coherent illumination aerial images. The bottom panel shows the remaining difference between the ideal and the OAI intensity transforms which is more pronounced than for the 45° orientation of FIG. 7.

Figure 10:
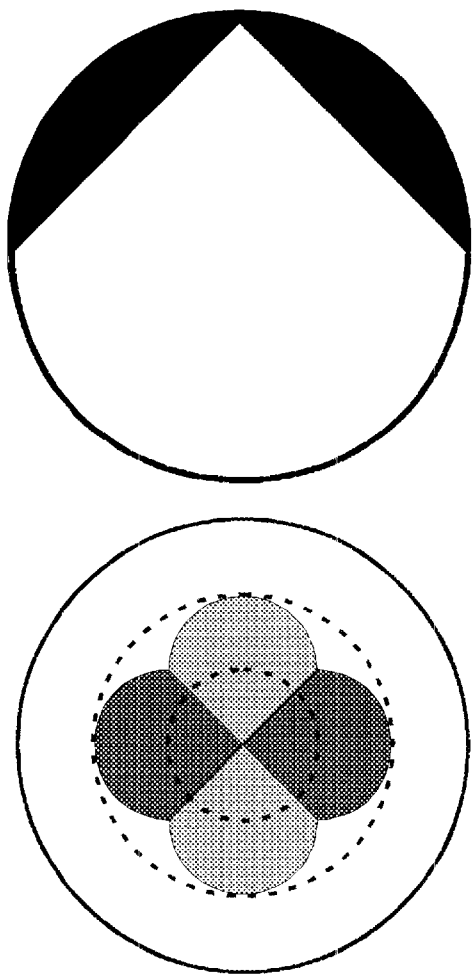

FIG. 10: The top panel shows a pupil plane filter used to avoid multiple counting of spatial frequency terms for a quadrupole off-axis exposure. The offset is chosen to put the zero-order diffraction from the mask just at the upper vertex. The filter must be rotated appropriately for each separate offset of the quadrupole requiring two (or four for telecentricity) exposures. The bottom panel shows the resulting frequency space coverage (NA=0.65, $\eta$=1) extending out to $2f_{opt}$ along the pattern axes.

Figure 11:
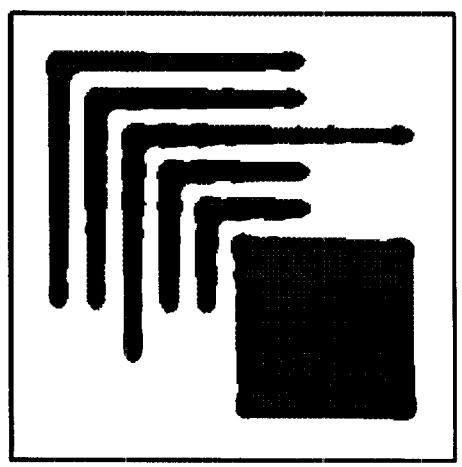

FIG. 11: Model calculation image at a CD of 85 nm with NA=0.65 ($\kappa_1$=0.29) for OAI with $\eta$=1 and θ=0° using the pupil plane filter of FIG. 10. The bandwidth is $2f_{opt}$ allowing the smaller CD, and the pattern fidelity is quite good with comparable dense-isolated line bias as for OAI without pupil plane filters at a CD of 130 nm.

Figure 12:
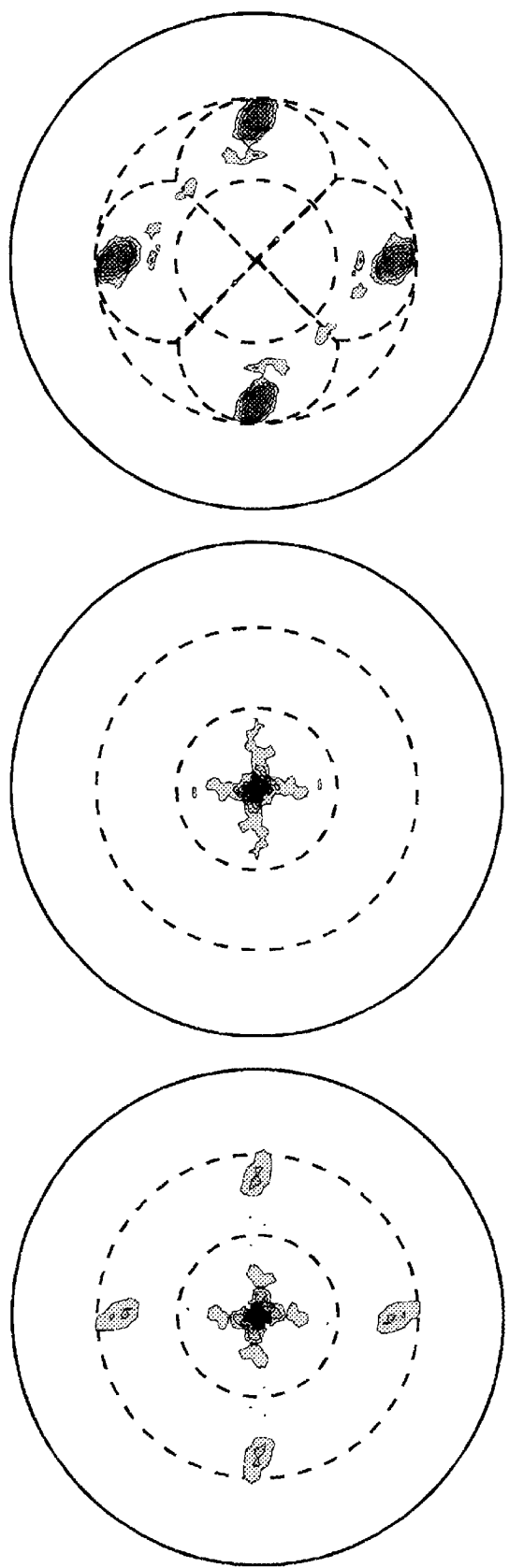

FIG. 12: Frequency space interpretation of OAI for the exposure of FIG. 11. The top and middle panels give the positive and negative differences between the intensity Fourier transforms of the OAI and the coherent illumination aerial images. The bottom panel shows the remaining difference between the ideal and the OAI intensity transforms. With pupil plane filtering, OAI comes closer to the ideal optics limit within the bandwidth constraints.

FIG. 13: Chromeless phase-shift and blocking binary mask for printing a 'u'. The height of the phase shifted region is 2.5 CD to result in a pattern with a 1 CD separation between the two arms of the 'u'. The dotted line shows the cut for the electric field plots of FIG. 14.

FIG. 14: Electric field profiles and corresponding 1D Fourier transforms for a cut along the dotted line (FIG. 13) just at the mask for a blocking chrome mask and for a chromeless PSM. The range of the electric field variation is doubled for the PSM which doubles all of the non-zero frequency Fourier magnitudes as show in the bottom part of the figure. The dc Fourier component is decreased because of the partial cancellation due to the negative field region. As a result the quadratic imaging terms are dramatically increased relative to the linear terms giving the frequency doubling effect of PSMs.

FIG. 15: Resulting model calculation of the printed pattern (CD=106 nm, 193-nm exposure, NA=0.65). The high-frequency, edge enhancement characteristic of chromeless PSM is evident. However, the pattern comers are badly rounded because the lens bandpass cuts off even the findamental frequencies that define the comers at these dimensions.

FIG. 16: Model calculation test pattern images at a CD of 69 nm with NA=0.65 ($\kappa_1$=0.23) for IIL. The top panel shows the calculated image without any pupil plane filters. The overlaps between the low- and high-frequency exposures around $f_{opt}$ result in some dense-isolated line bias that is eliminated by introducing pupil plane filters (bottom panel).

Figure 17:
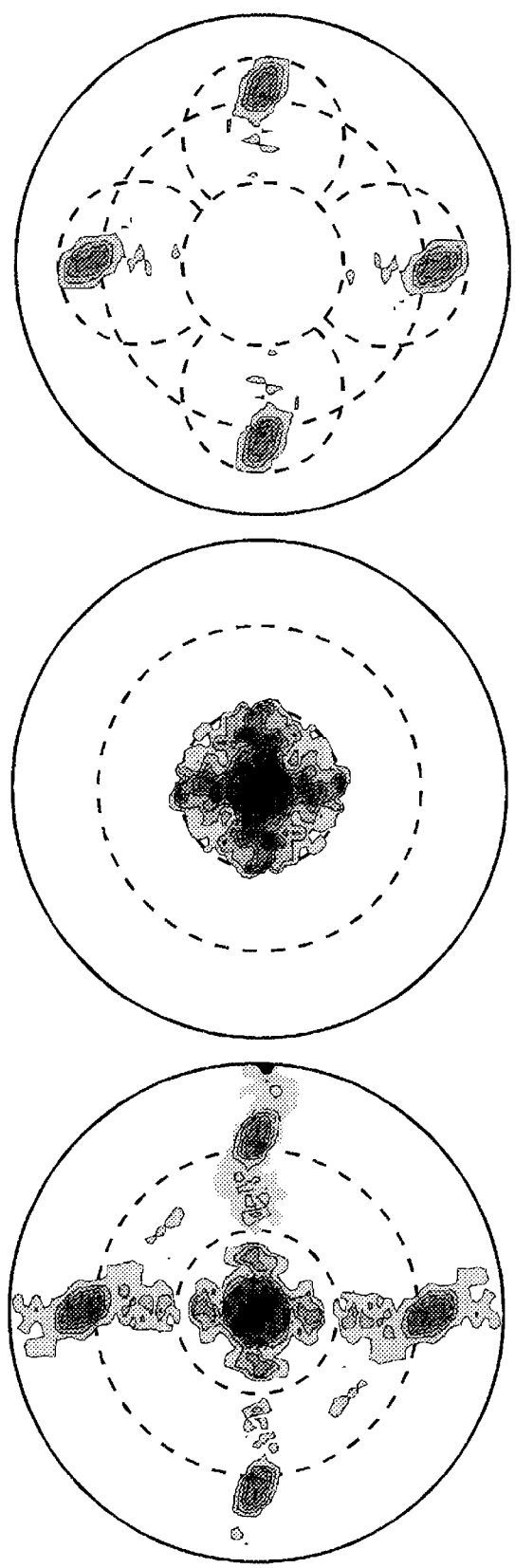

FIG. 17: Frequency space interpretation of IIL for the exposure of FIG. 16 (bottom). The top and middle panels give the positive and negative differences between the intensity Fourier transforms of the IIL (with pupil plane filters) and the coherent illumination aerial images. The bottom panel shows the remaining difference between the ideal and the IIL intensity transforms. IIL provides the closest approach to the ideal optics limit of any of the resolution enhancement techniques.

Figure 18:
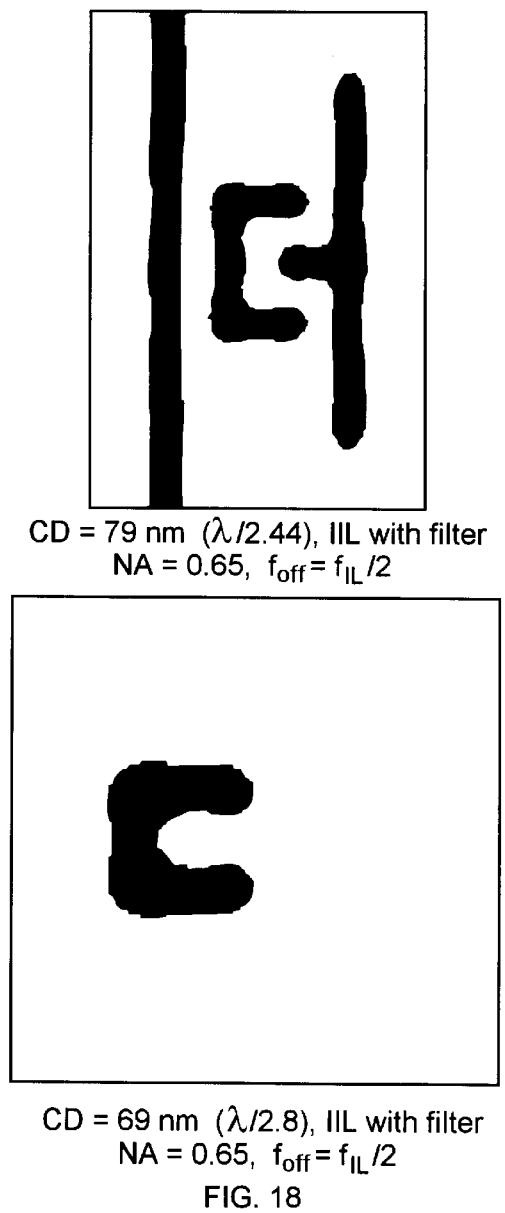

FIG. 18: IIL image patterns for binary chrome-on-glass masks for the same patterns used to illustrate OPC (FIG. 3) at 79-nm CD ($\kappa_1$=0.27) and PSM (FIG. 15) for a 69-nm CD ($\kappa_1$=0.23).

Figure 19:
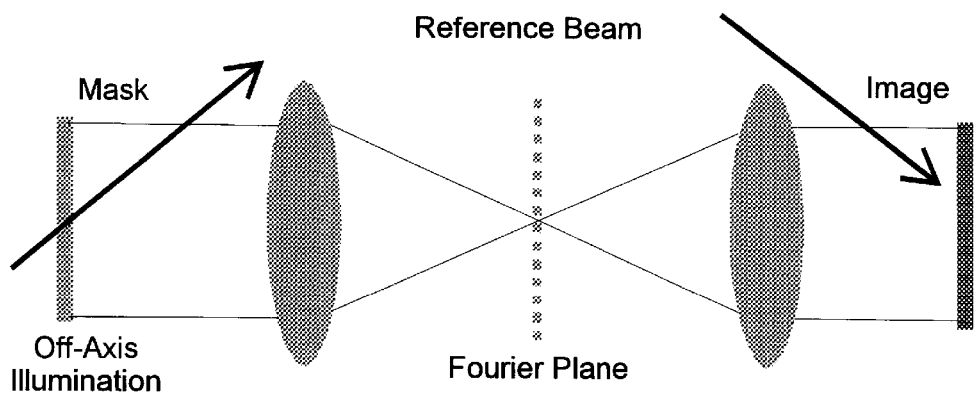

FIG. 19. Imaging interferometric lithography optical system. Off-axis illumination down-shifts the high spatial frequencies of the mask pattern and interferometric optics resets these frequencies back to their original values at the wafer.

Figure 20:
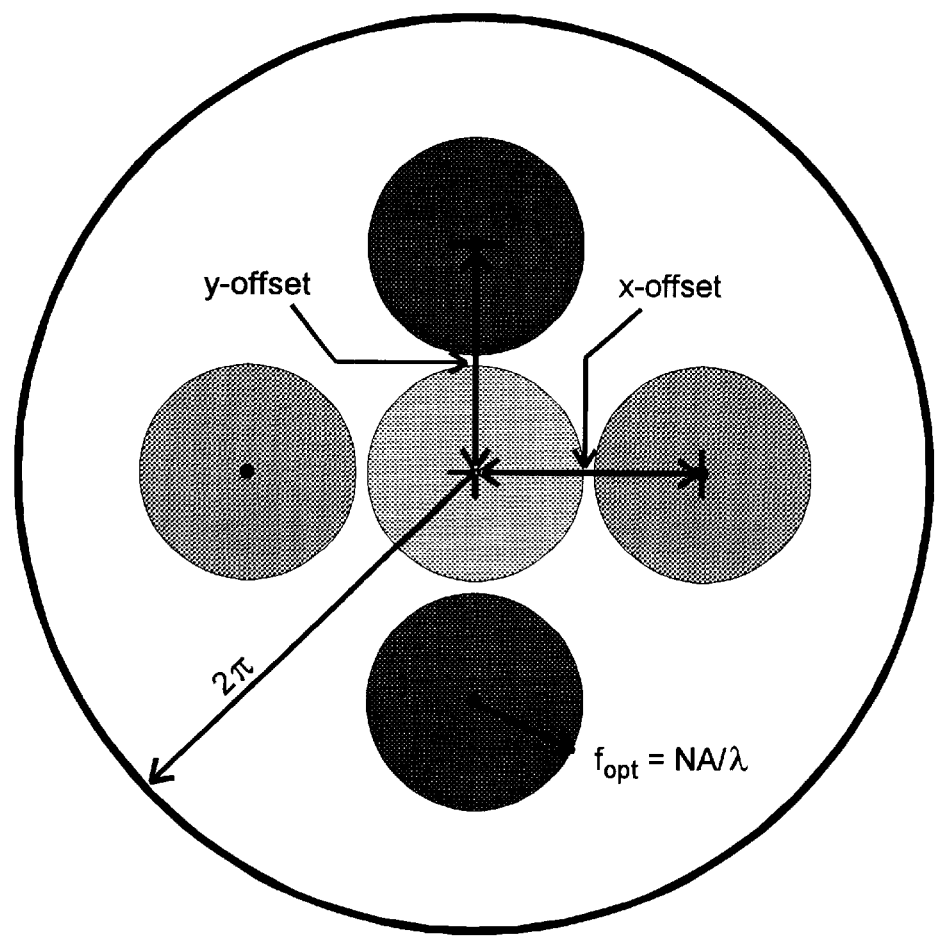

FIG. 20. Frequency-space picture of imaging interferometric lithography. The larger circle with radius of $2/\lambda$ is the frequency space accessible by optics. The radii of the smaller circles are NA/$\lambda$ and the offsets are determined by the off-axis IILumination angles.

FIG. 21. Schematic of the condenser Illumination pupil plane aperture stop for quadrupole IILumination.

FIG. 22. Frequency-space picture of optical lithography with quadrupole Illumination. The radius of the circles are determined by the NA of the optical system and the offset frequency is determined by the position and orientation of the quadrupole apertures (poles). (top): $f_{off}$=0.75 $f_{opt}$ $\theta$=45°, 135°, 225°, 315; (bottom): $f_{off}$=0.75 $f_{opt}$, $\theta$=0°, 90°, 180°, 270°.

Figure 23:
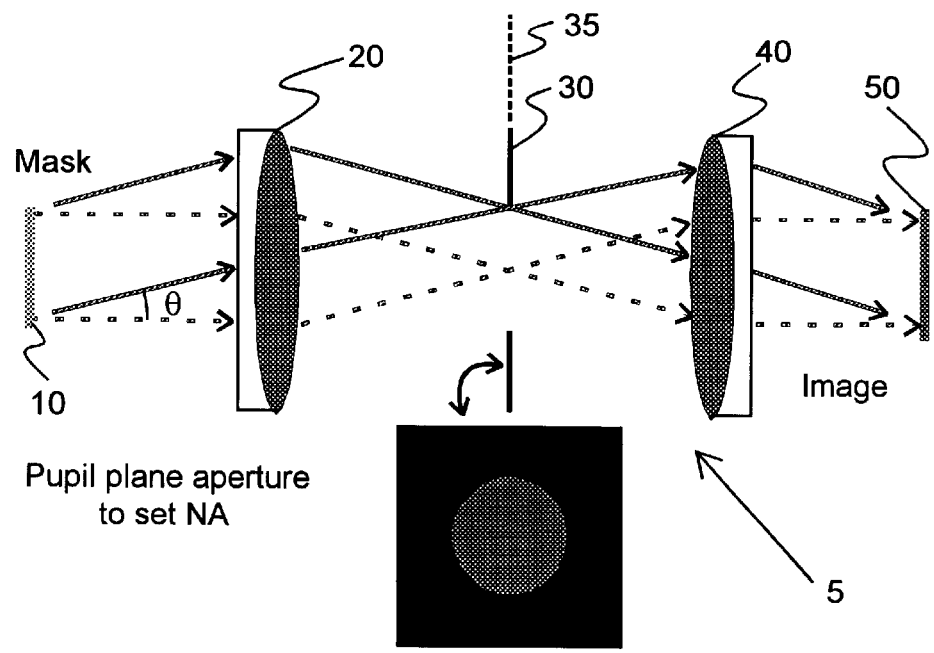

FIG. 23. Optical system used for the experiments. Circular aperture stop with the diameter of 16 mm was employed at the Fourier plane to effect a nearly diffraction-limited optical system (NA~0.04). Pupil plane filters (within the NA) were used in some of the exposures to avoid multiple counting of space frequency components.

Figure 24:
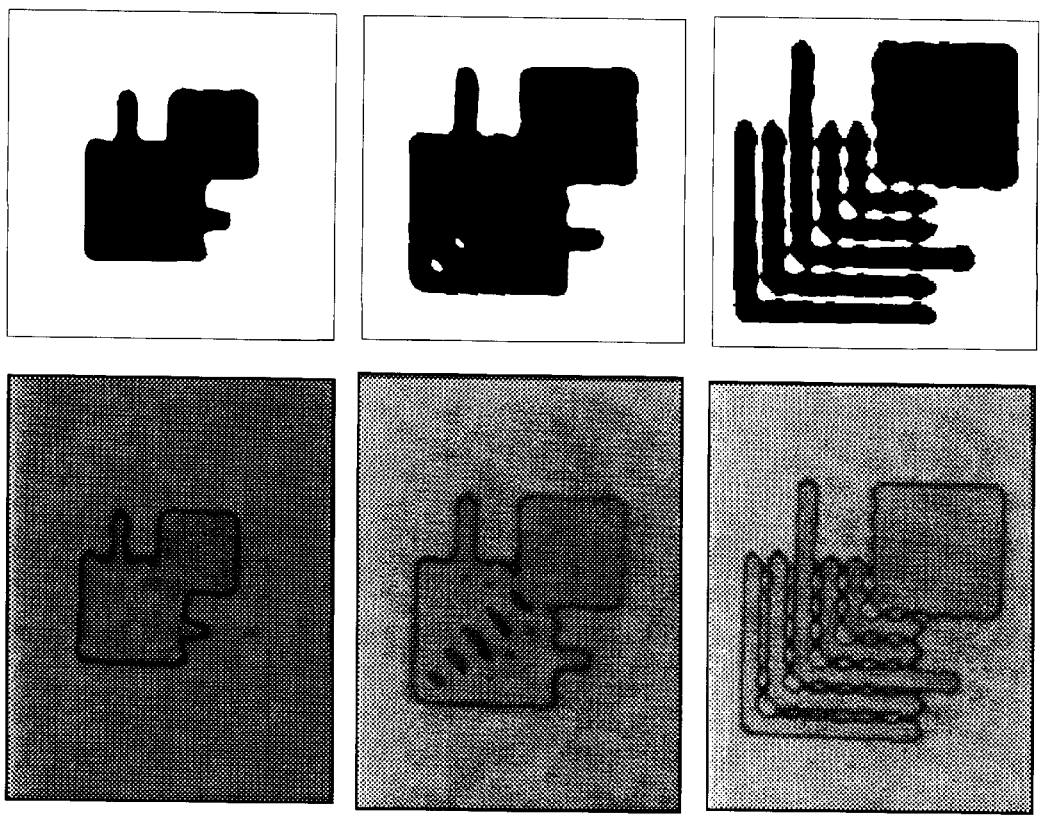

FIG. 24. Experimental determination (left column) of the resolution of the optical system with an NA of 0.04. Patterns include both dense and isolated lines at 1×CD as well as a large 10×10 CD² box at CDs of 3 um (top); 4 um (middle); and (c) 5um (bottom). The 5-um CD test pattern is characteristic of a coherently illuminated optical system just at the cut-off frequency. Resolution of this system is estimated at a dense CD of ~5.5 um. Simulation results (right column) are in good agreement with the experiment.

Figure 25:
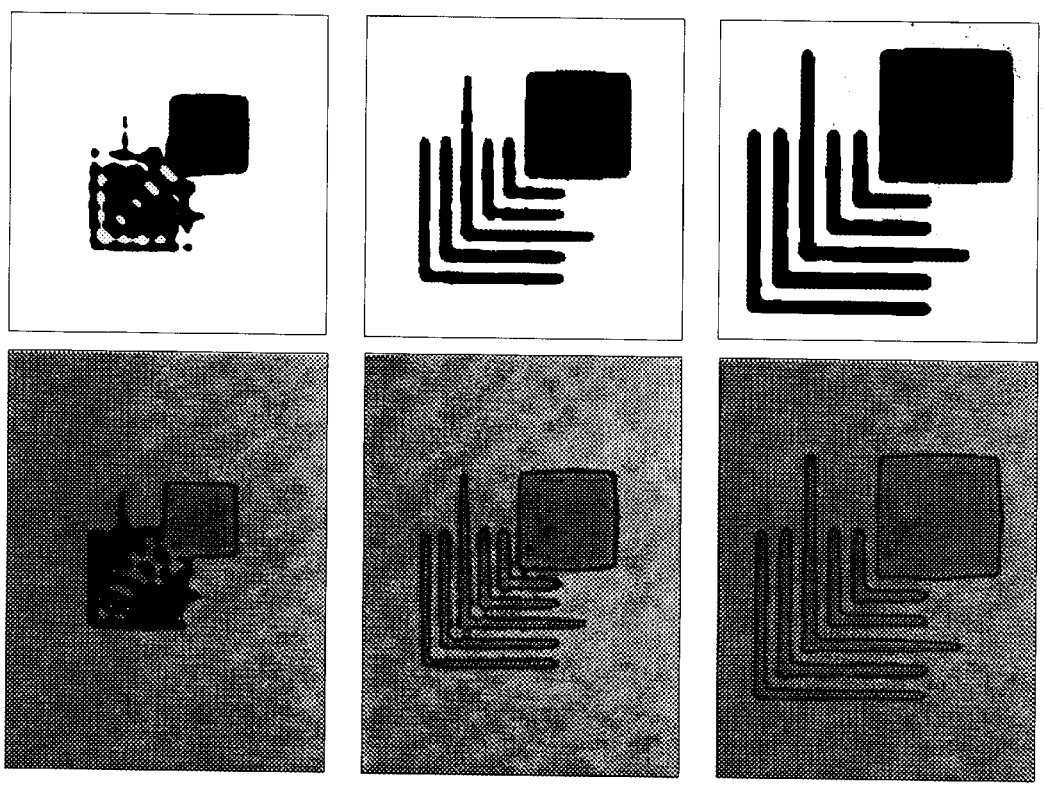

FIG. 25. Experimental images (left) and simulations (right) printed by 45° quadrupole OAI with $f_{off}$=0.75 $f_{opt}$. CDs are 3 um (top), 4 um (middle) and 5 um (bottom). The frequency space coverage was insufficient to print the 3-um pattern in this exposure geometry. Note the excellent agreement between the experiment and simulation extending to fine pattern details.

Figure 26:
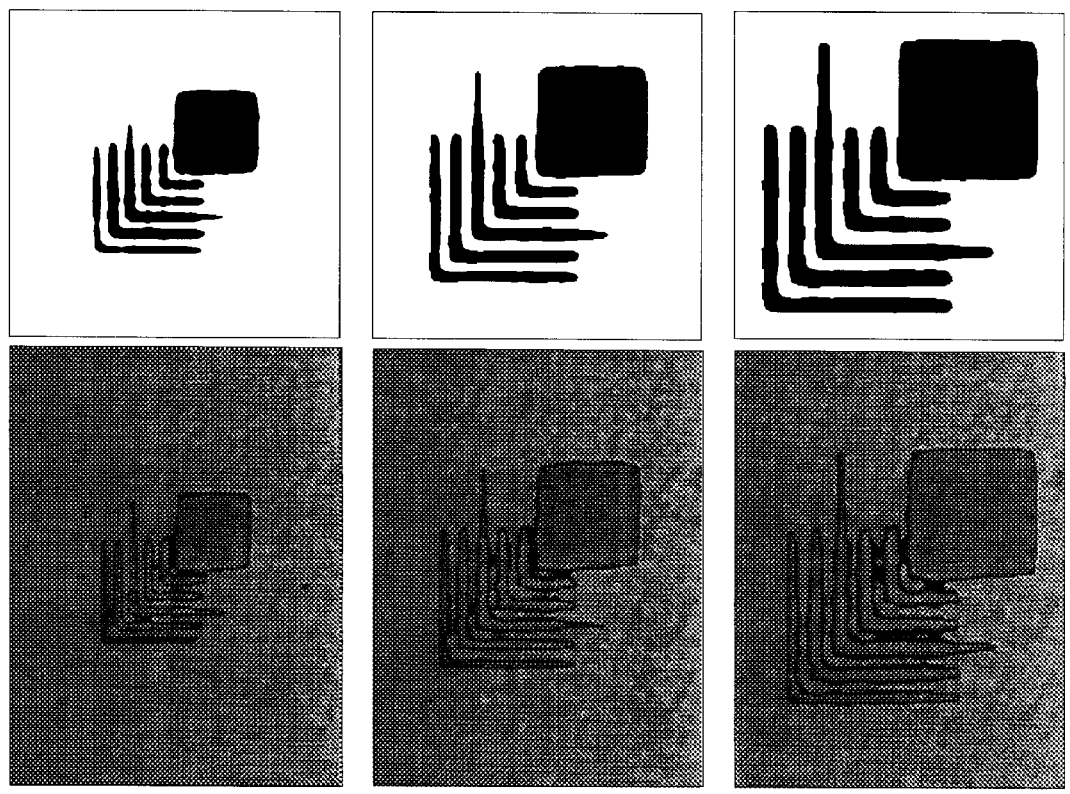

FIG. 26. Test structures and simulations at dense CDs of 3 um, 4 um, and 5 mn (top to bottom) printed by 0° quadrupole OAI with $f_{off}$=0.75$f_{opt}$. The higher frequency coverage allows resolution of the 1×CD lines at 3 um; however, the lower MTF in this geometry results in more pattern distortion.

Figure 27:
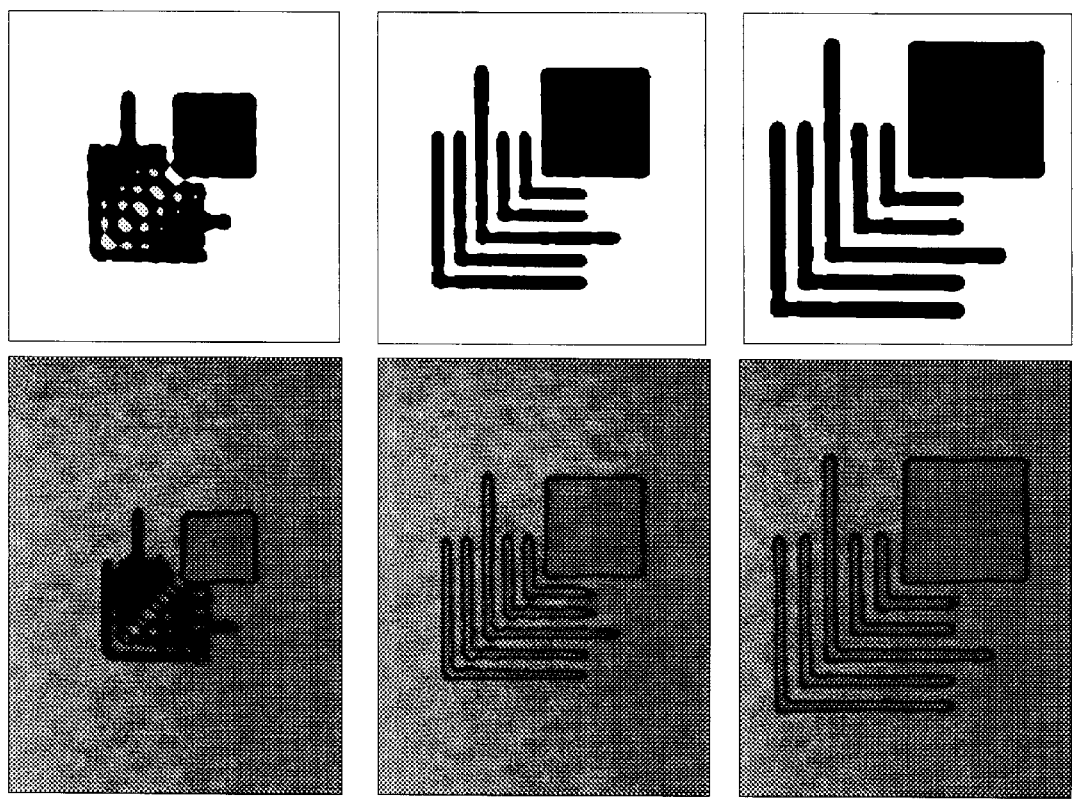

FIG. 27. Test structures and simulation results at dense CDs of 3 um, 4 um, and 5 um printed by 45° quadrupole OAI with $f_{off}$=$f_{opt}$. While the pattern fidelity is improved, the frequency space extent is still insufficient to resolve the 3-um CD structures.

Figures 28, 29:
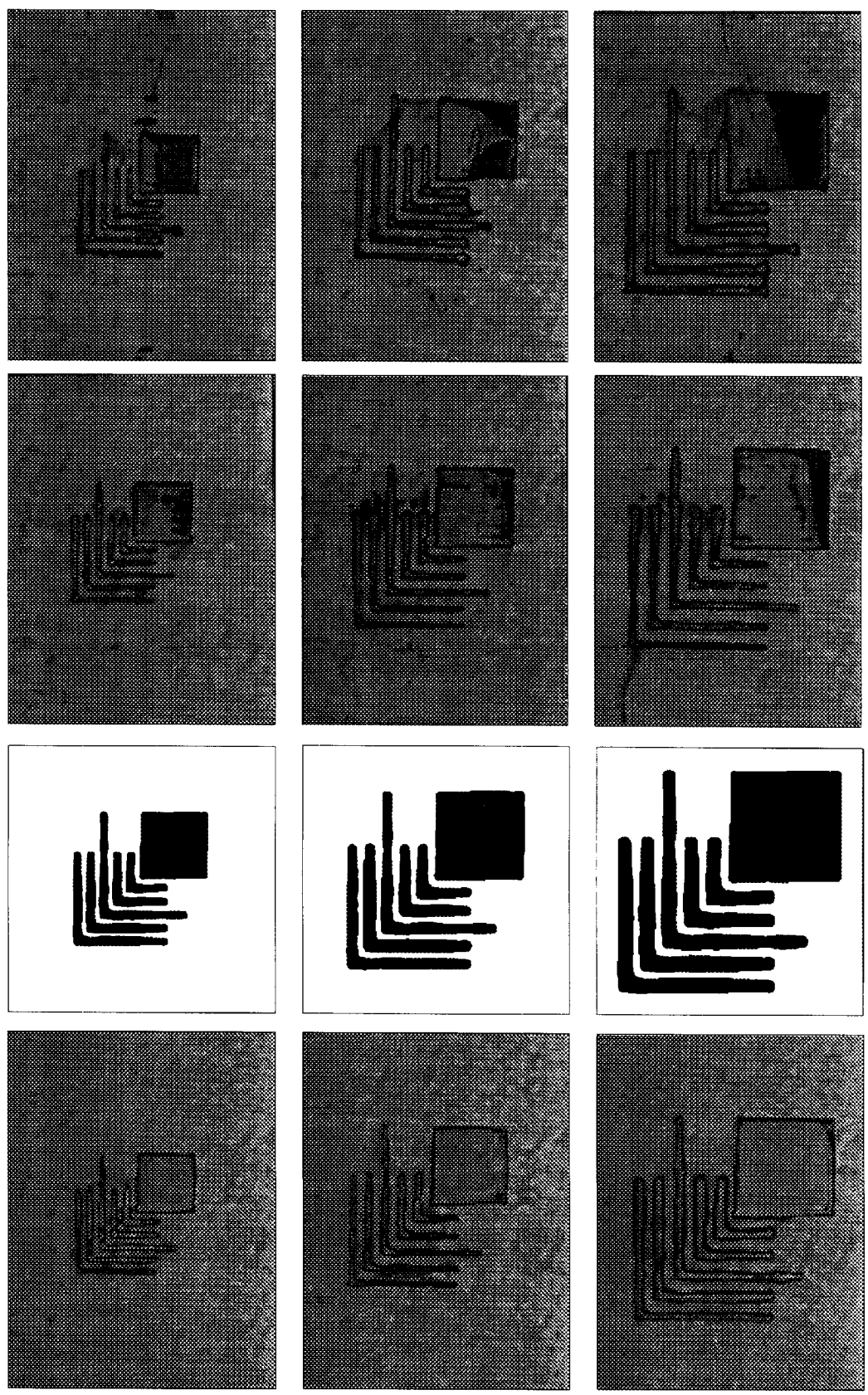

FIG. 28. Test structures and simulations at dense CDs of 3 um, 4 um, and 5 um printed by 0° quadrupole OAI with $f_{off}$=$f_{opt}$ showing improved fidelity over the comparable results at smaller offsets (FIG. 27).

FIG. 29. Test structures at dense CDs of 3 um, 4 mn, and 5 unn printed by OAI with $f_{off}$=$f_{opt}$, and x-directed (left) and y-directed (right) pupil plane filters to eliminate spectral overlaps. In each case the lines covered in the filtered offset exposures are improved over those in the complementary, unfiltered exposure.

Figure 30:
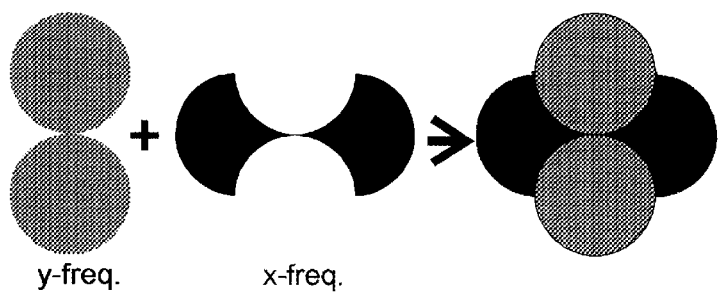

FIG. 30: Frequency space coverage for the x-directed exposure of FIG. 30. Frequency space is 'tiled' so that there are no regions represented in more than one exposure.

FIG. 31. Test structures and simulations at the dense CDs of 3 um, 4 um and 5 um (top to bottom) printed by OAI with a symmetric pupil plane filter employed in both x- and y-offset exposures.

Figure 32:
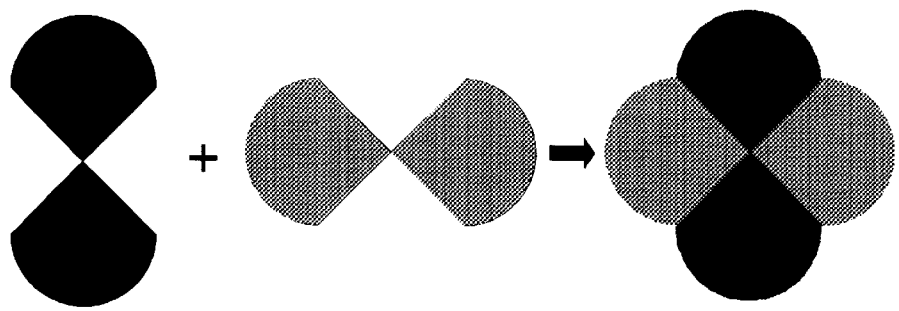

FIG. 32: Frequency space coverage for the symmetric pupil plane filter of FIG. 31.

FIG. 33. Test structures and simulations at the dense CDs of 3 rim, 4 um, and 5 um (top to bottom) printed by three exposure IIL at $f_{off}$=$f_{opt}$ with a pupil plane filter.

Figure 34:
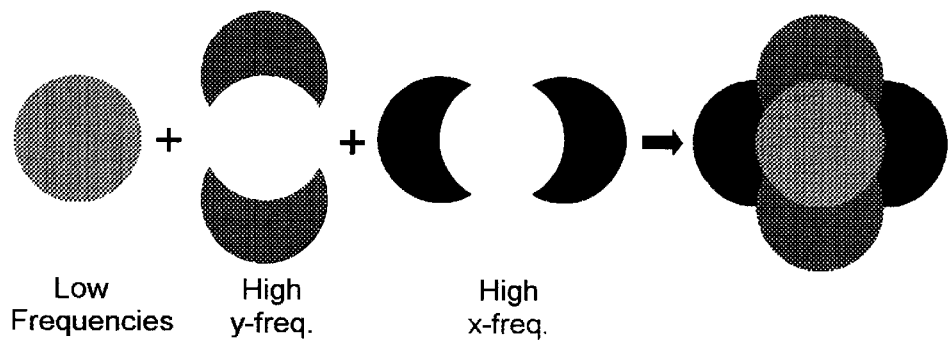

FIG. 34. Frequency space coverage for the IIL exposure of FIG. 33.

Figure 35:
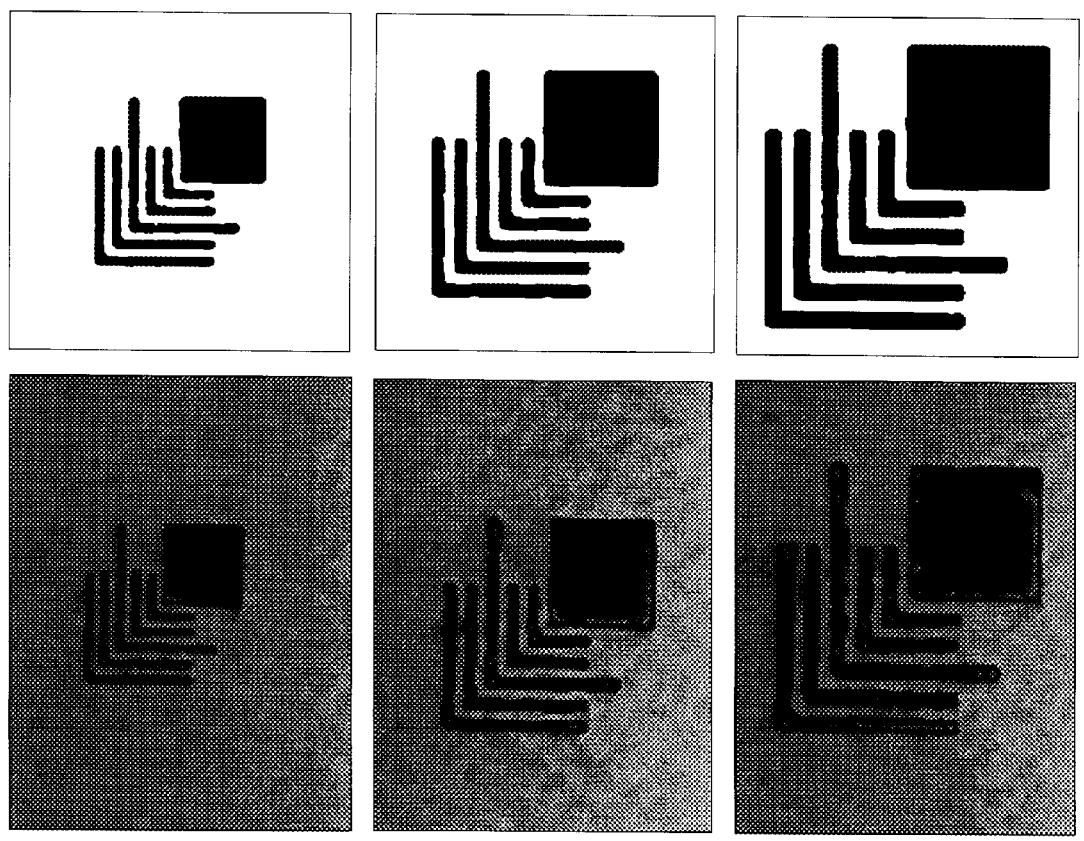

FIG. 35. Test structures and simulations at the dense CDs of 3 $\mu$m, 4 um, and 5 um (top to bottom) printed by three exposure IIL at $f_{off}$=$f_{opt}$, with different pupil plane filter with a smaller NA of 0.03 for the low-frequency exposure.

Figure 36:
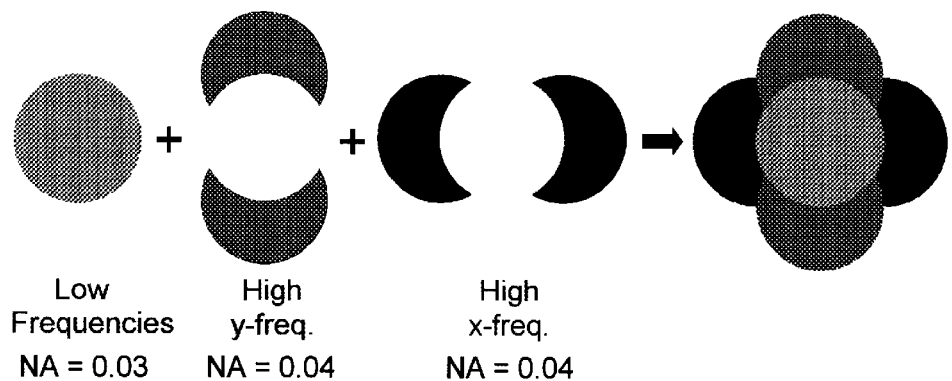

FIG. 36: Frequency space coverage for the IIL exposure of FIG. 35.

Figure 37:
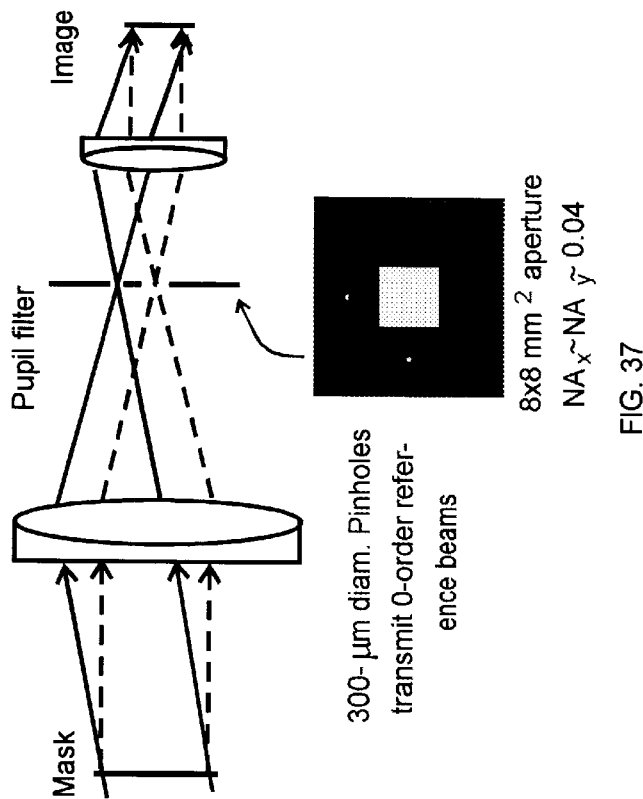

FIG. 37. 2X reduction IIL system. A square pupil plane filter was used to obtain a nearly diffraction-limited optical system. Two pinholes pass the 0-order reference beams for the offset exposures.

FIG. 38. Frequency-space picture of IIL. The larger circle with radius of 2/ is the frequency space accessible by optics. The size of the smaller circles (squares) are determined by the NA of the optical system and the offset frequency is determined by the off-axis illumination angle.

Figure 39:
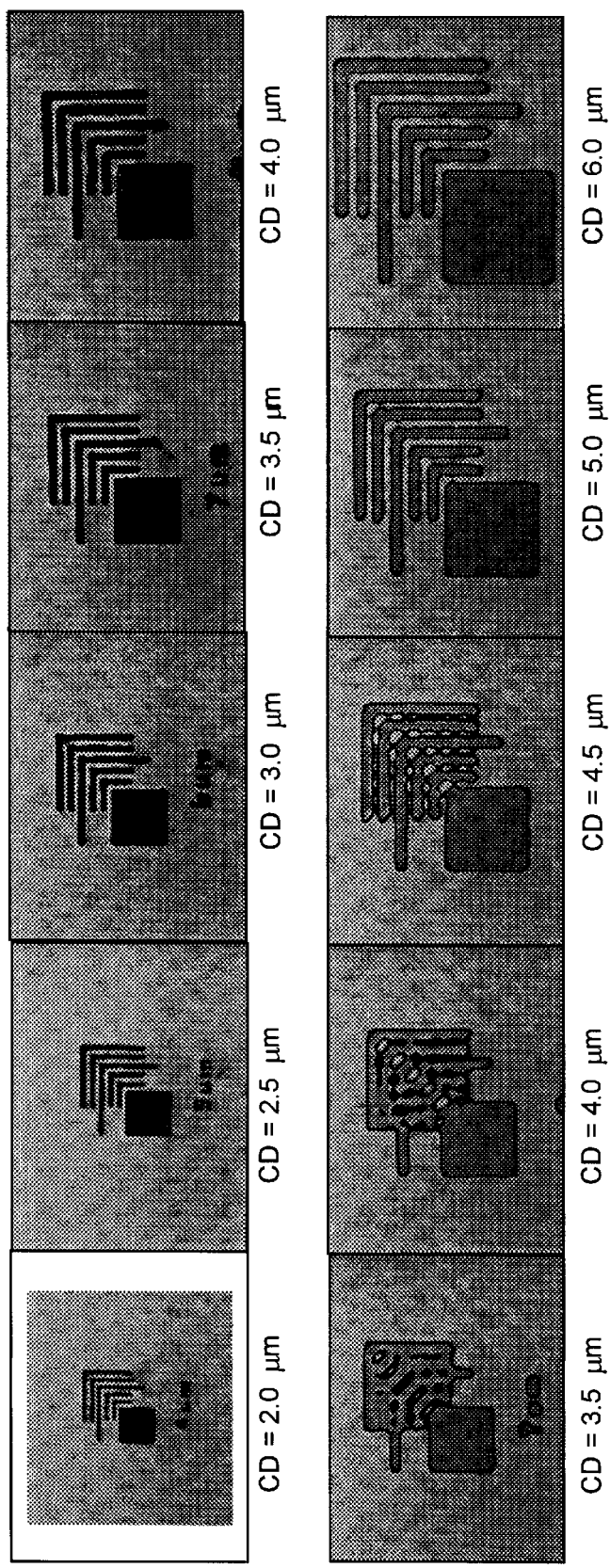

FIG. 39. Top row: micrographs of the test patterns printed by three exposure IIL. The labels (mask size) below each of the test patterns were also resolved. Bottom row: micrographs of the patterns printed by conventional coherent illumination.

FIG. 40 is a Table showing frequency space limits of various RET techniques.

DETAILED DESCRIPTION OF PREFERRED EXEMPLARY EMBODIMENTS

The techniques of OAI and IIL, as discussed above, extend the frequency coverage of optical lithography by using non-normal incidence illumination and a combination of coherent and incoherent addition of image spatial frequency information in the photoresist. However, in many cases, different incoherent exposures (which can, but do not necessarily, occur simultaneously) cover some common and some different regions in frequency space. The result is an uneven coverage of the linear imaging terms resulting in an image distortion. The image distortion occurs in OAI where the off-axis illumination is constrained to be at an angle less than $\sin^{-1}$ (NA), i.e. within the imaging system pupil. As discussed above, the image distortion often occurs in IIL depending on the specifics of the optical system. These overlaps and the resulting image distortions often limit the usefulness of these techniques for many manufacturing applications. The present invention incorporates pupil plane filters with OAI and/or IIL to significantly reduce or eliminate these spectral overlaps between different exposures and significantly improve the image quality.

More particularly, the performance of OAI can be improved by incorporating pupil plane filters to reduce or eliminate the multiple recording of pattern spatial frequencies that leads to the decreasing MTF at high frequencies, at the expense of requiring multiple exposures with changes in the filter between exposures. By eliminating the overlaps with pupil plane filters, OAI can be extended to $\kappa_1 \sim 0.3$. As noted above, one skilled in the art will appreciate that many different tilings of frequency space are possible; however, only one, with a high degree of symmetry, will be presented here. FIG. 10 shows the pupil plane filter in the top panel. This filter is suitably oriented along the pattern y-direction as shown for the exposure offset in the +y-direction ($\phi=\pi/2$) and rotated appropriately for each of the other offset angles ($\phi=\pi, 3\pi/2, 0$) requiring four separate exposures. The resulting tiling of frequency space for the image intensity is shown in the bottom panel. The shading differences in this figure preferably identify the areas of frequency space covered in each set of exposures and do not connote any difference in the effective linear MTF which is 1 throughout the entire covered region of frequency space. FIG. 10 is scaled for an optical system NA of 0.65.

FIGS. 11 and 12 show, respectively, an exemplary real-space and corresponding spatial frequency space plots for this optical configuration (193 nm, NA=0.65, pupil plane filters as in FIG. 10) at a CD of 85 nm ($\kappa_1=0.29$). A very good image, comparable to the 130-nm CD result of "conventional" OAI is obtained at this small CD. The frequency space plots (FIG. 12) show that the relative intensity of the high-frequency components has been increased over the previous examples with no filters as expected, but more is still needed to get to the ultimate limit of 'linear' optics. This is a result of the multiple incoherently summed exposures each of which contributes to low-frequency baselines that reduce the high-frequency contrast. Again, a minimum CD can be calculated based on frequency space limitations, giving 88 nm for a 193-nm exposure. This is consistent with FIG. 12 which shows that the added frequencies are just at the limiting frequencies of $2f_{opt}$ and line-edge fluctuations are just starting to appear (FIG. 11). As mentioned above, to obtain the improved performance, the multiple pupil plane filters are suitably adjusted between exposures.

Based on this analysis, $\kappa_1$s of ~0.45 (at 45° orientation and without pupil plane filters) to ~0.3 are accessible with OAI. A major advantage of OAI over OPC and PSM is the use of standard, binary chrome-on-glass masks where the mask and image features are simply related. As will be discussed below, imaging interferometric lithography (IIL) is an extension to OAI that allows higher spatial frequencies, and thus smaller CDs or, equivalently, smaller $\kappa_1$s.

FIGS. 16 and 17 show exemplary real-space and frequency space results of IIL. The calculation is for a CD of 69 nm at an exposure wavelength of 193 nm and an optical system NA of 0.65 ($\kappa_1=0.23$). Because $f_{off}<1$ is restricted to less than $2f_{opt}$ for these parameters there is overlap, at frequencies around $f_{opt}$ between the coverages of the low frequency and offset exposures. As was the case in OAI, these can be substantially reduced or eliminated with pupil plane filters. The top panel of FIG. 16 shows the pattern without any pupil plane filters. The overlap results in a noticeable dense/isolated line bias, in the opposite direction from that of OAI because of the different frequency region of the overlap, and a distortion of the large square. The bottom panel shows the image when pupil plane filters are used in the offset exposures to eliminate the overlaps. The pattern is significantly improved, the remaining dense/isolated line bias is the result of the limits of the high frequency coverage; this becomes more pronounced in the modeling at a 63-nm CD. FIG. 17 shows exemplary corresponding frequency space plots. The enhanced frequency coverage as compared with OAI is evident. The qualitative limiting calculation based solely on the frequency space coverage gives a minimum CD of 69 nm, in good agreement with the modeling. For a somewhat smaller NA $\alpha$ 0.5, the frequency coverage extends to $3f_{opt}$, (and the $\kappa_1$ to 0.2) without any overlap or need for pupil plane filters.

IIL is not restricted to this specific test pattern. For completeness, FIG. 18 shows the results of using IIL with conventional chrome-on-glass masks and pupil plane filters for the same patterns as were used to illustrate OPC (FIG. 2) at a CD of 79 nm and PSM (FIG. 15) for a 69-nm CD In both cases, IIL provides a more faithful image at a smaller CD.

Table 1 summarizes the conclusions of the unified frequency space treatment of all of the current resolution enhancement techniques discussed above. From a frequency space perspective, it is straightforward to evaluate the limits of each technique. OPC is restricted to frequencies only somewhat larger than $f_{opt}=NA/\lambda$ giving a limiting $\kappa_1$ of ~0.45. Without using pupil plane filters (e. g. $\theta=45°$), OAI extends to $\sqrt{2}f_{opt}$ or $\kappa_1\sim 0.4$. Adding pupil plane filters (at $\theta=0°$) can extend the frequency coverage of OAI out to $2f_{opt}$ or $\kappa_1\sim 0.3$. Phase shift masks also permit a maximum frequency of $2f_{opt}$ but are somewhat more restricted because of the requirement of allowing the fundamental frequency through the optical system, giving a limit of $\kappa_1\sim 0.35$. IIL provides the highest frequency coverage, out to either (1+NA)/ or 3NA/$\lambda$, depending on the NA, for a telecentric configuration and consequently the lowest $\kappa_1\sim 0.23$ to 0.2. Using a nontelecentric optical system, the linear systems optical limit of $2/\lambda$ can be reached. All of the simulations scale linearly with wavelength. Thus the limiting pattern CD for IIL of ~69 nm scales to 130 nm at i-line and to 56 nm at a 157-nm wavelength ($F_2$ laser).

This discussion has focused on the maximum attainable spatial frequencies for each RET. Optimizing other important lithographic performance measures such as process latitude, pattern placement, and depth-of-field within the spatial frequency bounds delineated here is an equally important task. For the ultimate performance, the present invention preferably combines multiple RETs, e.g. OAI or IIL and PSM or OPC, and incorporates more complex, pattern-specific pupil plane filters, etc.

As discussed, imaging interferometric lithography (IIL) extends optical lithography (OL) to the linear systems resolution limit of optics. The following compares IIL and OL with off-axis illumination (OAI) and presents both numerical simulations and experimental verification. In OAI, the optical modulation transfer finction (MTF) decreases at higher spatial frequencies as a result of the inclusion of the same low frequencies in more than one of the incoherently related offset exposures. Pupil plane filters reduce or avoid this multiple counting of the low frequency components and improve the pattern fidelity. The following discloses different filters which provide different tiling of spatial frequency space for both OAI and IIL and result in significant differences in the final patterns. Overall, IIL provides the most robust imaging results.

Among the current RETs, the OAI approach is attractive as the resolution and DOF improvements are achieved without the difficulties of fabricating phase-shift and OPC masks. Unfortunately, for standard schemes, OAI patterns suffer from strong dense/isolated line biases as well as other distortions, limiting their usefulness. The experiments and simulations discussed herein show that much of this distortion is due to a reduction in the modulation transfer function at high frequencies that are suitably managed with pupil plane filters. Imaging interferometric lithography (IIL), an extension of OAI to larger offset angles beyond the imaging system numerical aperture, has been developed recently as a novel resolution enhancement approach to extend the life of familiar optical lithography to ultimate, linear-systems limits. (See, for example, S. R. J. Brueck, "Imaging interferometric lithography," Microlithography World, Winter, 2–10(1998). X. Chen and S. R. J. Brueck, "Imaging interferometric lithography for arbitrary patterns," SPIE 3331, Emerging Lithographic Technologies II, Y. Vladimirsky, ed., 214(1998). X. Chen. S. R. J. Brueck, "Imaging Interferometric Lithography—A Wavelength Division Multiplex Approach to Extending Optical Lithography", J. Vac. Sci. Technol., to be published (1998), the entire contents of the foregoing are incorporated herein by reference). Analysis shows that the IIL technique can extend the resolution to dense CDs of /3 while maintaining an arbitrary pattern capability. Initial experiments demonstrated an increase in the frequency-space coverage to 3NA/λ with a consequent 3× improvement in resolution. In the context of the conventional Rayleigh resolution expression, all of these resolution enhancement methods are aimed at improving optical lithography resolution performance by effectively decreasing the $\kappa_1$ alue with the IIL approach offering the lowest $\kappa_1$ of ~0.2. OAI and IIL techniques reduce the IIL offset frequency to within the optical system spectral bandwidth (NA/λ). The use of pupil-plane filters to reduce or eliminate the multiple frequency coverage in the low frequency region and effectively increase the MTF values at high spatial frequencies. Different tilings of spatial frequency space are also investigated.

Models for imaging interferometric lithography and off-axis illumination will now be discussed As previously discussed, imaging interferometric lithography addresses the spatial frequency limitations of conventional lithography by shifting different portions of frequency space into the lens bandpass in different exposures. Incoherently combining multiple exposures in the photoresist results in an image covering a much larger region of frequency space than is available with conventional imaging. The present invention can be used in conjunction with the exploitation of the techniques of signal and image processing that have been so successful in expanding the capabilities of communications and radar. In many ways, this is analogous to the use of wavelength division multiplexing (WDM) in communications to address the problem of single channel bandwidths that are much less than transmission medium bandwidth. The WDM solution is to use multiple, passively combined and separated, independent channels. In the lithography case, the transmission medium bandwidth is 2I, (corresponding to counterpropagating beams at grazing incidence to the wafer), much larger than the imaging optical system bandwidth of ~NA/λ.

FIG. 19 shows an exemplary IIL arrangement. Off-axis illumination is preferably used to down shift the high spatial frequencies generated with the mask to low frequency where they can be suitably collected by the lens. In order to shift the high frequency components back to their original frequencies, a coherent reference beam is introduced at the wafer plane which interferes with the image spatial frequency components passing through the optical system and up-shifts these components back to their original spatial frequencies. In a preferred embodiment, a number of exposures are used to cover a sufficient region of frequency space to achieve a faithful image. For a Manhattan-geometry rectilinear pattern whose frequency components are concentrated around the $f_x$; and $f_y$ axes, the majority of the necessary frequency components can be covered by only three exposures: one offset exposure in the x-direction, one in the y-direction and one conventional (non-offset) exposure to provide the low frequency information. If $f_{off}=\sin f/\lambda$ denotes the x-directed offset frequency introduced by the off-axis illumination in the configuration of FIG. 19 and a reference beam is incident $(-f_{off})$ obliquely at the wafer plane, then the intensity distribution for an x off-axis illumination is described as:

$$I_x(x, y) = \tag{10}$$

$$\left| e^{-i2\pi f_{off}x} + \sum_{f_x}\sum_{f_y} M(f_x, f_y)T_{coh}(f_x - f_{off}, f_y)e^{i2\pi(f_x-f_{off})x}e^{i2\pi f_y y} \right|^2$$

$$= \sum_{f_x}\sum_{f_y} M(f_x, f_y)T_{coh}(f_x - f_{off}, f_y)e^{i2\pi f_x x}e^{i2\pi f_y y} +$$

$$\sum_{f_x}\sum_{f_y} M^*(f_x, f_y)T_{coh}(f_x - f_{off}, f_y)e^{-i2\pi f_x x}e^{-i2\pi f_y y} + 1 +$$

$$\sum_{f_x}\sum_{f_y}\sum_{f'_x}\sum_{f'_y} \left[ \begin{array}{c} M(f_x, f_y)T_{coh}(f_x - f_{off}, f_y)M^*(f'_x, f'_y) \times \\ T_{coh}(f'_x - f_{off}, f'_y)e^{i2\pi(f_x-f'_x)x}e^{i2\pi(f_y-f'_y)y} \end{array} \right]$$

where $M(f_x, f_y)$ is the Fourier transform of the mask transmission function normalized to the zero order transmission and shown as a discrete summation for convenience. $T_{coh}(f_x, f_y)$ is the coherent modulation transfer function (MTF) of the optical system (=1 for $\sqrt{f_x^2+f_y^2}<NA/\lambda;=0$ otherwise) (See, for example, J. W. Goodman, "Introduction to Fourier Optics", 2nd ed., McGraw-Hill, 1996) which limits the high frequency response of the imaging system. For simplicity, Eq. 1 has been written for a unity magnification. As has been demonstrated, IIL is fully compatible with reduction optical imaging. The first two terms in Eq. 1, which are referred to as "linear terms" (in the Fourier amplitude), are the reconstructed high spatial frequency components of the mask pattern (complex-conjugate pairs of a real image) that have been down shifted to pass through the lens and up-shifted back to their original spatial frequencies by introducing the appropriate interferometric bias. Note particularly that $f_{off}$ appears only in the argument of the coherent MTF and not in the spatial frequency exponents. An additional, incoherently related x-offset illumination from the opposite side of the system may be needed to restore symmetry through focus and preserve the telecentricity of the image, but it does not necessarily add any additional spatial frequency information. The constant term is inherent for an intensity distribution as the intensity cannot be negative. The last term in Eq. 1, which is referred to as "quadratic term" (in the Fourier amplitudes), also results from the square-law photoresist response. This "quadratic term" has a significant impact on the final image, and is the basis of phase-shift mask RET, as discussed above. A similar formula applies to y-directed off-axis illumination. For Manhattan-geometry patterns, the total exposure dose will be the sum of the intensities for the x- and y-offset exposures and one conventional OL exposure. AC)

FIG. 20 is an exemplary frequency-space picture associated with IIL. The large circle with radius of 2/λ preferably represents the maximum spatial frequency accessible by optics. With coherent illumination a diffraction limited lens faithfully transmits the spatial frequency components of an image up to a maximum spatial frequency $f_{opt}=NA/\lambda$. The frequency coverage of the conventional OL exposure is represented by the small circle with the radius of $f_{opt}$ in the center of FIG. 20. For an x-directed offset IIL exposure, the frequency coverage is represented by two circles described by the "linear terms" centered at $f_x=\pm f_{off}$ with a radius of $f_{opt}$. The y-direction offset exposure in frequency space is similarly represented by the two circles offset by $\pm f_{off}$ along the $f_y$ axis.

Annular and quadrupole illumination are the two OAI schemes used most often to increase the resolution of OL. In general, quadrupole illumination is preferred for Manhattan geometry patterns and is also the variant most closely related to ILL. Three parameters define a quadrupole illumination (FIG. 21): the offset frequency ($f_{off}$) which is determined by the distance ($\sigma_R$) of the quadrupole aperture to the center of the pupil plane, the orientation ($\phi$) of the quadrupole aperture relative to the x-axis of the pattern and the radius of the quadrupole aperture ($\sigma_r$) which determines the partial coherence. For very small quadrupole apertures ($\sigma_r \to 0$), the quadrupole off-axis exposure is equivalent to four, independent, coherent offset exposures with the offset frequency determined $f_{off} \cos \phi$) and $f_{off} \sin \phi$) in the x- and y-directions. The intensity distribution for the exposure resulting from one of the apertures is:

$$I(x, y) = \left| \sum_{f_x} \sum_{f_y} \left[ \begin{array}{l} e^{-i2\pi f_{off} x \cos\varphi} e^{-i2\pi f_{off} y \sin\varphi} + \\ M(f_x, f_y) T_{coh}(f_x - f_{off}\cos\varphi, f_y - f_{off}\sin\varphi) \times \\ e^{i2\pi(f_x - f_{off}\cos\varphi)x} e^{i2\pi(f_y - f_{off}\cos\varphi)y} \end{array} \right] \right|^2 = \quad (11)$$

$$\sum_{f_x} \sum_{f_y} \left[ \begin{array}{l} M(f_x, f_y) \times T_{coh}(f_x - f_{off}\cos\varphi, f_y - f_{off}\sin\varphi) \times \\ T_{coh}(-f_{off}\cos\varphi, -f_{off}\sin\varphi) e^{i2\pi f_x x} e^{i2\pi f_y y} + c.c. \end{array} \right] +$$

$$|T_{coh}(-f_{off}\cos\varphi, -f_{off}\sin\varphi)|^2 +$$

$$\sum_{f_x} \sum_{f_y} \sum_{f'_x} \sum_{f'_y} \left[ \begin{array}{l} M(f_x, f_y) \times M^*(f'_x, f'_y) \times \\ T_{coh}(f_x - f_{off}\cos\varphi, f_y - f_{off}\sin\varphi) \times \\ T_{coh}(f'_x - f_{off}\cos\varphi, f'_y - f_{off}\sin\varphi) e^{i2\pi(f_x - f'_x)x} e^{i2\pi(f_y - f'_y)y} \end{array} \right]$$

The zero frequency term has been pulled out in Eq. 2 to allow easy comparison with Eq. 1. The summations do not include the (0,0) term which corresponds to the $0^{th}$ order diffraction (transmission) of the illumination beam. This term is equivalent to the reference beam in Eq. 1 which interferes with the high frequency components to reset the frequencies back to their original position. Again, the complex conjugate terms in Eq. 2 are the "linear terms" which represent the straightforward image information within a frequency coverage of two radius $f_{opt}$ circles shifted from the origin by $\pm f_{off}$ along an axis oriented at a rotation of $\phi$ from the pattern x-axis. As in Eq. 1, the "quadratic" terms of Eq. 2 are the result of the intensity response of the photoresist and give image contributions that are indirectly related in the desired pattern. The opposite aperture at $\phi=\phi+\pi$ gives the identical frequency coverage without providing any additional imaging information, but preserves the symmetry through focus. The remaining two apertures offer similar space frequency coverage along the orthogonal frequency-space axis. A spatial frequency picture of quadrupole illumination can be obtained by eliminating the OL exposure in FIG. 20 and by rearranging the offset circles according to $f_{off}$ and $\phi$. FIG. 22 shows the exemplary frequency coverage of a quadrupole off-axis illumination for a typical $f_{off}=0.75 f_{opt}$. The orientation of the quadrupole apertures are $\phi=45°$(top) and $\phi=0°$ (bottom), respectively. As is evident in FIG. 22, some of the low-frequency regions are covered in more than one circle. This overlap emphasizes the low frequencies and leads to a decrease of the MTF at high frequencies. The 0° quadrupole geometry offers more high frequency coverage along the $f_x$ and $f_y$ axes than the 45° quadrupole geometry at the price of smaller MTF values at high frequencies.

Due to the pupil plane constraints of an optical system, the offset frequency ($f_{off}$) of OAI is necessarily less than $f_{opt}$. So the maximum frequency coverage for the OAI technique is limited to $2f_{opt}$, while the ultimate space frequency limit of optics is $2/\lambda$. The IIL approach can access the ultimate space frequency limit by bringing the reference beam outside the optical system, i.e. $f_{off} > f_{opt}$. Therefore, IIL can provide much better frequency coverage (extending to $f_{off}+f_{opt}$) than that of OAI with a correspondingly enhanced resolution. Multiple counting of the low frequency components with a consequent roll-off the MTF value at high frequencies is another issue associated with OAI. In the present invention, pupil plane filters are preferably employed to avoid multiple counting of the low frequency components and ensure that both the low frequency and high frequency components are equally weighted. Although pupil filters with different shapes give the same "linear terms" to cover the frequency space, different "tiling" schemes result in different "quadratic terms" which significantly affect the final image as shown below.

A modeling and simulation effort provides important insight into these OAI and IIL image strategies and their relationships. A simple model based on Eq. 1 and Eq. 2 and an ideal, threshold photoresist intensity response has been developed to investigate the influence of space frequency coverage to the pattern in the real space. Simulation results are in excellent agreement with the experiments. A detailed comparison of the modeling and simulation results is presented below.

With respect to the experimental arrangements, an exemplary optical system 5 used for the experimental results is shown in FIG. 23. Both lens systems 20, 40 are 200-mm focal length, f/4 achromatic doublets with a geometrical NA of 0.125. A circular aperture stop 30 with a diameter of 16 mm was centered in the Fourier plane 35 of the optical system to restrict the NA to ~0.04. This provides a nearly diffraction-limited system although aberrations are still evident with a shearing-plate interferometer when a plane wave is transmitted through the optical system with an offset near the outer edge of the NA. These aberrations lead to spatially varying alignment errors in the images. As the maximum offset illumination angle in the experiments is within the lens NA, the reference beam for IIL was provided through the lens system without requiring any additional interference optics. Pupil plane filters within the overall NA (0.04) were employed in some of the IIL and OAI exposures to avoid multiple counting of frequency components. Small holes (~300-um diameter) were made in the IIL pupil plane filters to pass the $0^{th}$ order reference beam for the IIL exposures when necessary.

In a preferred embodiment, a standard chrome-on-quartz mask with a Manhattan-geometry test pattern, containing both dense and isolated lines at the CD as well as a large square at 10×10 $CD^2$, was used in the experiments. The 6×6 $mm^2$ field of the reticle was filled with arrays of the test pattern in four quadrants with dense CDs of 2-, 3-, 4-and 5-um. The edges of the Manhattan-geometry test pattern were aligned parallel to the x- and y-axes of the image plane for most of the experiments. The exposure source was a cw 364-nm Ar-ion laser (i-line). The $TEM_{00}$ Gaussian laser beam was expanded using a 20× UV-objective and collimated with a 100-mm aperture, 500-mm focal length lens. Offset illumination angles ($\theta_{off}$) were chosen according to the required offset frequencies. To mimic OL with quadrupole illumination, off-axis illumination was provided by offsetting the illumination in the x- and y-directions with the mask rotated to give the quadrupole orientation parameter $\phi$. The final image intensity is a summation of the intensities of all the individual exposures with unity relative doses. The resist used was Shipley 510L with 1:1 resist:thinner dilution spin coated on a bare silicon wafer at a thickness of ~250 nm. Exposed samples were developed using Shipley MF CD-26 developer and images were inspected using an optical microscope.

The resolution capability of the optical system was determined experimentally. A top-down view of test patterns at dense CDs of 3, 4 and 5 um printed by a conventional, coherent OL exposure are shown in FIG. 24 along with simulation results in excellent agreement with the experiment. As the high spatial frequency information is not transmitted by the optics, only the outline of the 3-um test structure is printed. Although some structure is evident for the 4-um pattern, there is not enough resolution to define the pattern details. The 5-um test pattern is almost resolved by the NA=0.04 system. The scalloped edges are characteristic of a coherent exposure with dense line/space frequencies (½CD) just inside the cutoff limit ($f_{opt}$). The maximum resolution of this system was estimated at around 5.5 um corresponding to a $\kappa_1$ of 0.6. Using both OAI and IIL with offsets within the lens pupil, the resolution capability of the optical system is significantly improved. Features down to 3 um are clearly resolved. Experimental results of OAI and IIL exposures with and without pupil plane filters are discussed in the following sections. Simulation results, which reproduce even the fine pattern details, are also presented.

With respect to OAI, quadrupole OAI was mimicked using the experimental setup shown in FIG. 23 and two exposures with orthogonal offsets. An offset frequency of 0.75$f_{opt}$ was selected by tilting the illumination at the appropriate angle. This offset is typical of that used for partially coherent exposures. Exposures with the mask rotated 45° were conducted to simulate the standard 45° quadrupole OAI. The corresponding frequency space coverage is illustrated in FIG. 4a. FIG. 25 shows the pattern in real space along with the simulation results. Improvement in the resolution is demonstrated by the resolved 4- and 5-um test structures; the maximum frequency does not extend out far enough to resolve the 3-um pattern in this geometry. There is some dense/isolated line bias (the isolated line and the dense line are printed at different width) and distortions at the inside corners for the 4-um pattern. Modeling results are inconsistent with the experiments even in the details including the dense/isolated line bias, the distortion in the large square box and the missing areas in the 4-um inside corners.

Exposure for a $\phi$=0° quadrupole OAI configuration provides more high frequency coverage [FIG. 4(b)] as discussed previously, but at the expense of a lower MTF for moderate spatial frequencies. FIG. 26 shows the patterns printed by such an exposure along with the corresponding simulation. All 3-, 4- and 5-pm test structures are resolved as a result of the increased high frequency coverage along the $f_x$ and $f_y$ axes. However, the pattern fidelity is not as good as for the 45° patterns (FIG. 25). The dense/isolated line bias is more pronounced, there are linewidth variations from line to line as well as distortions along the lines and on the big square. Lower effective MTF values at moderate frequencies associated with the $\phi$=0° quadrupole illumination geometry have been identified as the causes of these problems. Again the simulation is in excellent agreement, showing not only the overall pattern behavior but also details such as the linewidth modulation of the middle 'ell' and the positions of the uncleared resist bridges for the 3-un pattern.

OAI experiments at an offset frequency of $f_{opt}$ have also been conducted by tilting the illumination beam to the limit of the optical system NA defined by the pupil plane aperture (FIG. 23). This is the maximum achievable offset frequency for OAI and consequently yields the maximum frequency coverage. This large offset can only be achieved with a coherent illumination source that allows a vanishingly small partial coherence. FIG. 27 shows the patterns printed by 45° quadrupole OAI geometry and the corresponding simulation results. Although there are still not enough high frequencies to resolve the 3-um test structure, the dense/isolated line bias and inside corners of the Sum patterns are improved compared to the patterns in FIG. 25. These improvements are attributed to the higher frequency coverage and the reduced extent of the multiple counting at low frequencies. FIG. 28 shows the exemplary patterns printed by 0° quadrupole OAI geometry at the offset frequency of $f_{opt}$ and the corresponding simulations. The dense/isolated line bias is much less pronounced compared to the 0.75$f_{opt}$ offset results (FIG. 26). However, there are still distortions at the corners of the "ells" as well on the large square because of the low frequency spectral overlaps. In addition, there are undulations on the isolated lines for all the CDs due to the specific frequency coverage in this experiment, which clearly appear on the simulated patterns as well.

In summary, the 45° quadrupole exposure geometry offers better images than the 0° quadrupole exposure geometry for our Manhattan test pattern. This conclusion is consistent with the results reported by others. (K Kamon, T. Miyamoto, Y. Myoi, H. Nagata, M. Tanaka and K. Hone, "Photolithography system using annular illumination," Jpn. J. Appi. Phys., Vol. 30, No.1 1B. 3021–3029(1991). N. Shiraishi, S Hirukawa, Y. Takeuchi and N. Magome, "New imaging technique for 64 M-DRAM," SPIE 1674, Optical/Laser Microlithography V, 741–752(1992). As discussed earlier. the trade-off of employing the 45° quadrupole exposure geometry is a lower high frequency coverage than for the 0° geometry.

The use of pupil plane filters with OAI to avoid multiple counting of the low frequencies was investigated. For these experiments, the frequency space accessible by OAI is equally filled by the "linear terms" in Eq. 2 and the MTF values are uniform (=1) all the way out to the OAI space frequency limit. The off-axis illumination angle was adjusted to $f_{opt}=f_{opt}$ to achieve the maximum OAI frequency coverage. FIG. 29 shows the results of OAI exposures with pupil plane filter employed only in the x-offset exposure (left) and the corresponding results for only a y-offset filter (right). FIG. 30 shows the corresponding frequency coverage, for the x-offset filter case, of each individual exposure as well as for the sum of both exposures.

For this exposure, the lines parallel to the x-direction are much better quality than those along to the y-direction. This result is reversed for they-offset filter case.

FIG. 31 shows test structures imaged by OAI with a symmetric pupil plane filter used for both x- and y-offset exposures. The filter was rotated by 90° between exposures. FIG. 32 shows the frequency coverage for this exposure. The lines in both the x- and y-directions print with a similar quality and both have a comparable dense/isolated line bias. In the three examples presented in FIGS. 30 and 31, frequency space has been 'tiled' equivalently for the linear terms. However, the final images are far different from each other. It can be concluded that not only the uniform filling of the frequency space by the "linear terms" but also the "quadratic terms", which are different for different tilings of frequency space, impact the final images. The patterns shown in FIG. 31 are the best images achievable with OAI with the highest possible resolution. This improved OAI performance comes at the price of using a pupil-plane filter that needs to be adjusted between exposures.

For comparison with OAM, the same offset frequency ($f_{off}=f_{opt}$) was used for an IIL experiment (equivalent to the OAI experiment of FIG. 28 with the addition of a conventional coherent exposure), although the maximum offset frequency of IIL is not constrained to $f_{opt}$. At this offset frequency, overlaps of the low frequency circle and the high frequency circles in FIG. 19 occur for the three-exposure IIL, in addition to the overlaps between the high frequency circles already noted in conjunction with the results of FIGS. 25–31. Without the use of pupil plane filters, the IIL patterns showed significant distortions of the large square, rounding and placement errors of the 'ell' corners, and linewidth variations (ripples) along the straight line edges. In a more aggressive application of IIL (ie. $f_{off}>2f_{opt}$) these overlaps are geometrically eliminated and pupil plane filters are not required.

In order to make contact with the OAI results, pupil plane filters were introduced in the IIL experiment to reduce or eliminate the multiple-counting overlap effects. The top panel of FIG. 33 shows the results of the test structure exposure at the dense CDs of 3-, 4-, and 5-um. FIG. 34 illustrates the corresponding frequency coverages. Test patterns at all CDs were captured faithfully without dense/isolated line bias and distortion except for the unwanted holes printed on the 5-um CD test structure which also appear in the simulations. These holes were eliminated by employing a slightly different pupil-plane filter in the IIL exposures with a reduced NA (0.03) for the low frequency exposure. Shown in FIG: 35 are the three-exposure IIL results and in FIG. 36 the corresponding frequency coverage. All the 3-, 4- and 5-um test patterns were printed faithfully in experiment as well as in the simulation. The ridges evident along the large square are thicker regions of photoresist that show up in the optical micrographs but are not important for the lithographic response. In both experiments, the three-exposure IIL covers the same frequency space, i.e., the "linear terms" of Eq. 1 are the same, but the final images are different because of the different behavior of the "quadratic terms". It is worth noting that these three-exposure IIL experiments also tile the same frequency space with the "linear terms" as did the OAI exposures with pupil plane filters, but yield better images. While the emphasis of this work is on the connections between IIL and OAI, we have also successfully demonstratedIIL with larger offsets, where pupil plane filters are not required, in good agreement with modeling results. (See, for example, S. R. J. Brueck, "Imaging interferometric lithography," Microlithography World, Winter, 2–10(1998). X. Chen and S. R. J. Brueck, "Imaging interferometric lithography for arbitrary patterns," SPIE 3331, Emerging Lithographic Technologies II, Y. Vladimirsky, ed., 214 (1998). X. Chen. S. R. J. Brueck, "Imaging Interferometric Lithography—A Wavelength Division Multiplex Approach to Extending Optical Lithography", J. Vac. Sci. Technol., to be published (1998)) Based on this modeling, the ultimate IIL resolution limits for dense CDs and arbitrary patterns extend to ~$\lambda$/3, well beyond the present limits of optical lithography.

To summarize the foregoing discussion, IIL is a newly developed technique to extend the frequency coverage of OAI by allowing offset frequencies larger than $f_{opt}$. In order to retain traditional imaging characteristics, a zero-order reference beam at the appropriate angle must be reintroduced at the wafer. In the limit of offset frequencies within the imaging lens pupil, IIL is very similar to OAI with a different 'tiling' strategy for filling frequency space. We have presented a detailed experimental and simulation study of the connections between OAI and IIL. Modeling results are in excellent agreement with the experiments, reproducing even fine details of the experimental images. For OAI, the effective MTF values at high spatial frequencies are reduced due to the multiple low frequency coverages. Pupil plane filters were used to eliminate the multiple frequency coverage and enhance the image quality. Different tilings of frequency space impact the final image significantly. With the use of pupil plane filters and within the same frequency coverage, three-exposure IIL offers better imaging fidelity than two-exposure OAM for our Manhattan-geometry test structure. In the continuing quest to achieve the highest possible resolution for optical lithography, the present invention incorporates the use of pupil plane filters to the arsenal of RET techniques. This falls into a general category of image optimization within a fixed bandwidth constraint. The techniques of signal and image processing that have been so successful in other fields offer much potential for application in extending optical lithography to smaller scales with the necessary lithographic performance in areas such as process latitude and pattern placement.

Moreover, as discussed above, simple binary filters, e.g., either 0% or 100% transmission, are used to reduce spectral overlap between different exposures; however, further improvement in the image quality is achieved by using filters with a continuous variation in transmission between these limits. Continuous variation filters allow fine control over the image characteristics and allow a closer approach to the ideal linear systems limit of optics.

A frequency-space picture illustrates the IIL concept (FIG. 38). The large circle with radius of 2/$\lambda$ represents the maximum spatial frequency accessible by optics. The small circle with radius $f_{opt}$ centered at the origin is the region covered by a conventional OL exposure. For an x-directed offset exposure, as described by Eq. 37, the first two terms provide information in two conjugate offset circles of radius $f_{opt}$ shifted by $\pm f_{off}$. The low frequency terms are not represented in FIG. 38. A y-directed offset exposure provides coverage offset along the $f_y$-axis. Combining these exposures provides coverage over a much larger area of frequency space than available with OL alone. Choosing $f_{off}=2f_{opt}$ provides continuous frequency coverage out to $3f_{opt}$. A square pupil plane aperture (dotted lines in FIG. 37) provides more continuous coverage away from the principal frequency axes at the expense of a less efficient use of the natural circular aperture of the lens.

Experimentally, the achromatic-doublet lens focal lengths were 200- and 100-mm with a (wafer-side) geometrical NA of 0.125. A pupil plane filter is required to provide a nearly diffraction-limited system. A 8x8 mm square aperture filter restricted the NA to 0.04 (along the x- and y-directions). The offset illumination angle was set at $2f_{opt}$. As the lens physical aperture is larger than the effective imaging aperture, the reference beam was provided through the otherwise unused part of the imaging system NA without requiring any additional optics. Two ~300-lm diameter holes were provided in the pupil filter to pass the $0^{th}$ order for the offset exposures.

A standard chrome-on-quartz mask with a Manhattan-geometry test pattern with both dense and isolated lines at the CD as well as a large $10 \times 10$-$CD^2$ square was used. The field of the reticle (6×6 mm$^2$) was filled with arrays of the test pattern with the mask-side CDs varying from 2- to 12-pm. Coherent illumination was provided by a single frequency, 364-nm, TEM$_{00}$, Ar-ion laser. The beam was expanded using a 20× UV-objective and collimated by a 500-mm focal-length lens. A silicon wafer with a 250-nm thick photoresist coating (Shipley 510L with 1:1 resist:thinner dilution) was employed. Patterns were developed with Shipley M CD-26 and inspected optically.

The bottom row of FIG. 39 shows the test patterns (after 2× reduction) at wafer-side CDs of 3.5- to 6-$\mu$m printed with a conventional OL exposure. While some structure is evident in the two smallest patterns, there is insufficient resolution to define the dense line:space features. The 4.5-$\mu$m test pattern at the middle of the bottom row is almost resolved. The partially cleared edges of the fine lines are characteristic of a coherent imaging system operated very close to the coherent cutoff limit ($f_{opt}$). While the fundamental frequency of the dense line:space structure is passed by the optical system, the higher frequencies necessary to define the comers and edges are blocked. The right two panels of the bottom row show test patterns at the CDs of 5- and 6-$\mu$m resolved by the conventional optical exposure. The top row of FIG. 39 shows the wide range of pattern sizes printed by three-exposure IIL in a single exposure sequence. Test structures down to 2-$\mu$m CD are clearly resolved, corresponding to a $\kappa_1$ of 0.22 in the context of the conventional Rayleigh resolution expression. Moreover, the mask-size labels, which are more complex than the test structures, have also been resolved as a result of a continuous frequency space coverage of IIL.

2× reduction IIL has been experimentally demonstrated at the predicted threefold resolution improvement over OL. IIL mask requirements are simply a standard binary mask (Cr-on-quartz). Improvements in resolution are accomplished without adding any mask complexity. In the configuration of FIG. 37, the maximum offset frequency is $1/\lambda$, and the corresponding maximum spatial frequency is $(1+NA)/\lambda$. Modeling shows that arbitrary patterns at dense CDs of /3 can be achieved (i.e. 130 nm at I-line and 65 nm at a 193-nm exposure wavelength and an NA of 0.65) (S. R. J. Brueck, Microlithography World 7, 2 (1998) and X. Chen and S. R. J. Brueck, J. Vac. Sci. Technol., (1998), the entire contents of which is incorporated herein by reference). Multiple laser configurations can be envisioned in which the three IIL exposures are completed essentially simultaneously with no impact on the manufacturing throughput. In conclusion, IIL provides an approach to access the fundamental linear systems resolution limits of optics. Successful implementation of IIL technology will extend optics well beyond the limitations of traditional OL.

The present invention has a variety of applications. The techniques of OAI and ILL along with the use of pupil-plane filters are applicable in, for example, any diffraction-limited situation where the limit is imposed by the characteristics of the optical system rather than the transmission medium and where the illumination system is under the control of the experimenter. Traditional optical lithography fits this description. The transmission medium $f_{IL}=2/\lambda$, the optical system further constrains this to $\sim f_{opt}=NA/\lambda$ with $f_{opt} \ll f_{IL}$.

Microscopy is another important application that fits the above description for the applicability of the techniques of OAI and ILL along with the use of pupil-plane filters. OAI can be used in microscopy, while ILL provides even greater improvement in the bandwidth and should result in improved resolution. Because of the very large NA lenses (albeit with small fields) traditionally used in microscopy, pupil-plane filters provide a substantially uniform MTF across spatial frequency space. As discussed above, the maximum offset frequency is $f_{IL}/2$ and there is an unavoidable overlap in the frequency coverage for NA>0.5. Since NAs are as large as 0.8 to 0.9 in high-resolution microscopy, pupil-plane filters substantially reduce the deleterious effects of overlaps on the image fidelity. The overlap problem is further aggravated by the use of IIL with fully arbitrary patterns that do not have a Manhattan-geometry symmetry. In these situations, the present invention incorporates additional exposures for a complete coverage of frequency space and careful selection of pupil-plane filters to ensure a uniform response across frequency space.

In lithography, the image information is stored in chemical bonds that respond to the optical intensity. As discussed above, the linear and quadratic terms are not seperable because the linear terms contain the image information in a simple (WYSIWYG) way (i. e. the image is a replica of the mask) while the quadratic terms represent a more complex relationship between the mask and the image. The linear and quadratic terms are also not seperable in traditional microscopy using filmn However, in modem microscopy, the image is often captured electronically (for example, with a CCD camera), thereby allowing the separation of the linear and quadratic terms. For example, in IIL one could modulate the offset reference at 1, the image containing beams at $\omega_2$ and detect synchronously at $\omega_1+\omega_2$ This process suitably reduces the baseline problems associated with multiple exposures as well as improves the image by eliminating the effects of the quadratic terms.

As also discussed, the present invention not only applies to imaging with electromagnetic waves, the present invention also applies to improving the imaging properties of acoustic imaging schemes (for example, sonograms). Moreover, the present invention also applies to electron beam imaging (for example, SEM, IBM, etc.) and ion-beam imaging. In these cases, the diffraction limit is much smaller because of the much higher localization of these massive particles, and aberrations (particularly associated with space charge effects) often play a larger role.

Although the invention has been described herein in conjunction with the appended drawings, those skilled in the art will appreciate that the scope of the invention is not so limited. Modifications in the selection, design, and arrangement of the various components and steps discussed herein may be made without departing from the scope of the invention.

We claim:

1. Image transmission apparatus comprising an imaging lens system with a Fourier plane disposed therein, a lens opening disposed in the Fourier plane and having a numerical aperture (N.A.) configured to provide image transmission at different illumination directions at ,m optimized level of $\kappa_1$ in the simplified Raleigh resolution criteria $$CD = \kappa_1 \frac{\lambda}{NA}$$

where $\lambda$ is the optical wavelength of the image transmission, $\kappa_1$ is related to process latitude, and a pupil plane filter system associated with the lens opening and configured to provide orthogonalized and selected filtering of the image transmission through the lens opening such that spectral overlap at selected frequencies is reduced, to enhance the optimized optical image transmitted by the lens opening.

2. Image transmission apparatus comprising a substrate having a photosensitive medium, a mask, an illumination system configured to illuminate said mask, and an imaging lens system between said mask and said substrate;

said imaging lens system configured to reimage the illuminated mask image onto the photosensitive medium of said substrate;

said imaging lens system having a Fourier plane with a lens opening and being further configured to allow unobstructed access to the Fourier plane to allow different pupil plane filters to be inserted into said Fourier plane;

said imaging lens system being further configured to optimize the optical image transmitted by the lens opening; and said pupil plane filters being configured to transmit light in some regions of the Fourier plane and to block light in other regions, the transmitting regions of said pupil plane filters being determined in concert with the illumination directions of said illumination system to provide orthogonalized and selected filtering of the image transmission through the lens opening such that spectral overlap at selected frequencies is reduced, to enhance the optimized optical image transmitted by the lens opening and recorded by the photosensitive medium.

3. A method of transmitting an image from a mask to a substrate having a photosensitive medium, comprising the steps of illuminating the mask;

providing an imaging lens system between the mask and the substrate configured to reimage the illuminated mask image onto the photosensitive medium of said substrate, said imaging lens system having a Fourier plane with a lens opening and being further configured to allow unobstructed access to the Fourier plane to allow different pupil plane filters to be inserted into said Fourier plane, and said imaging lens system being further configured to optimize the optical image transmitted by the lens opening; and inserting pupil plane filters into said Fourier plane in a scheme configured to transmit light in some regions of the Fourier plane and to block light in other regions, the transmitting regions of said pupil plane filters being determined in concert with the illumination directions of said illumination system to provide orthogonalized and selected filtering of the image transmission through the lens opening such that spectral overlap at selected frequencies is reduced, to enhance the optimized optical image transmitted by the lens opening and recorded by the photosensitive medium.

4. A method as set forth in claim 3, wherein the imaging lens system is configured to reimage the illuminated mask image using off axis illumination (OAL).

5. A method as set forth in claim 3, wherein the imaging lens system is configured to reimage the illuminated mask image using imaging interferometric lithography (IIL).

* * * * *